(12) United States Patent
Park et al.

(10) Patent No.: US 12,416,949 B2
(45) Date of Patent: Sep. 16, 2025

(54) ELECTRONIC DEVICE INCLUDING BRACKET FORMED OF METAL MATERIAL

(71) Applicant: Samsung Electronics Co., Ltd., Suwon-si (KR)

(72) Inventors: Jungsik Park, Suwon-si (KR); Wonjoon Choi, Suwon-si (KR); Woongeun Kwak, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 428 days.

(21) Appl. No.: 17/960,430

(22) Filed: Oct. 5, 2022

(65) Prior Publication Data

US 2023/0161388 A1 May 25, 2023

Related U.S. Application Data

(63) Continuation of application No. PCT/KR2022/012344, filed on Aug. 18, 2022.

(30) Foreign Application Priority Data

Nov. 25, 2021 (KR) ........................ 10-2021-0164954

(51) Int. Cl.
*G06F 1/16* (2006.01)
*G06F 1/20* (2006.01)
*H01Q 1/24* (2006.01)

(52) U.S. Cl.
CPC .......... *G06F 1/1681* (2013.01); *G06F 1/1616* (2013.01); *G06F 1/203* (2013.01); *H01Q 1/243* (2013.01)

(58) Field of Classification Search
CPC ...... G06F 1/1681; G06F 1/1616; G06F 1/203; G06F 1/1641; G06F 1/1652;
(Continued)

(56) References Cited

U.S. PATENT DOCUMENTS 11,537,268 B2 * 12/2022 Kim ...................... G06F 1/1618
11,670,963 B2 * 6/2023 Yun ......................... H02J 50/80
320/108
(Continued)

FOREIGN PATENT DOCUMENTS

JP 2004-343625 A 12/2004
KR 10-2003-0083426 A 10/2003
(Continued)

OTHER PUBLICATIONS

Extended European Search Report dated Nov. 19, 2024, issued in European Application No. 22898767.3-1218.
(Continued)

*Primary Examiner* — Kabir A Timory
(74) *Attorney, Agent, or Firm* — Jefferson IP Law, LLP

(57) ABSTRACT

An electronic device is provided. The electronic device includes a foldable housing including a hinge structure, a first housing connected to the hinge structure and including a first side wall structure and a first bracket located inside the first side wall structure, and a second housing connected to the hinge structure and including a second side wall structure and a second bracket located inside the second side wall structure, the second housing being folded with the first housing about the hinge structure, a display panel extending from the first housing to the second housing across the hinge structure and configured to output a screen, and a second antenna structure including a second ground and a second feeding portion disposed on the second side wall structure of the second housing, wherein the first side wall structure of the first housing and the second side wall structure of the second housing may include a first metal material, and the first bracket of the first housing includes the first metal material, and the second bracket of the second housing may include a second metal material.

18 Claims, 14 Drawing Sheets

(58) Field of Classification Search
CPC ........ G06F 1/1698; H01Q 1/243; H01Q 1/24;
H01Q 21/28; H01Q 1/02; H04M 1/0216;
H04M 1/026; H04M 1/0268; H04M
1/0277; H05K 7/20; H05K 5/04; H05K
9/00; H05K 7/20336; H05K 7/20409;
H05K 9/002
See application file for complete search history.

(56) References Cited

U.S. PATENT DOCUMENTS

| | | | |
|---|---|---|---|
| 2014/0177186 A1 | 6/2014 | Song et al. | |
| 2015/0270618 A1 | 9/2015 | Zhu et al. | |
| 2017/0351297 A1 | 12/2017 | Kim et al. | |
| 2019/0103656 A1* | 4/2019 | Shi | H01Q 1/521 |
| 2019/0140342 A1 | 5/2019 | Lim et al. | |
| 2019/0194990 A1 | 6/2019 | Yoo et al. | |
| 2019/0369668 A1 | 12/2019 | Kim et al. | |
| 2020/0264674 A1* | 8/2020 | Km | G06F 1/1681 |
| 2020/0323089 A1 | 10/2020 | Rothkopf et al. | |
| 2020/0356143 A1* | 11/2020 | Oh | G06F 1/1616 |
| 2020/0373374 A1 | 11/2020 | Park | |
| 2020/0389999 A1 | 12/2020 | Lee et al. | |
| 2021/0034102 A1 | 2/2021 | Cho et al. | |
| 2021/0341973 A1 | 11/2021 | Kwon et al. | |

FOREIGN PATENT DOCUMENTS

| | | |
|---|---|---|
| KR | 10-2013-0055661 A | 5/2013 |
| KR | 10-2017-0072724 A | 6/2017 |
| KR | 10-2017-0120985 A | 11/2017 |
| KR | 10-2017-0136258 A | 12/2017 |
| KR | 10-2019-0019319 A | 2/2019 |
| KR | 10-1978242 B1 | 5/2019 |
| KR | 10-2019-0076680 A | 7/2019 |
| KR | 10-2019-0137433 A | 12/2019 |
| KR | 10-2020-0133888 A | 12/2020 |
| KR | 10-2021-0015468 A | 2/2021 |
| KR | 10-2021-0115617 A | 9/2021 |

OTHER PUBLICATIONS

International Search Report dated Nov. 18, 2022, issued in an International Application No. PCT/KR2022/012344.

* cited by examiner

ELECTRONIC DEVICE INCLUDING BRACKET FORMED OF METAL MATERIAL

CROSS-REFERENCE TO RELATED APPLICATION(S)

This application is a continuation application, claiming priority under § 365(c), of an International application No. PCT/KR2022/012344, filed on Aug. 18, 2022, which is based on and claims the benefit of a Korean patent application number 10-2021-0164954, filed on Nov. 25, 2021, in the Korean Intellectual Property Office, the disclosure of which is incorporated by reference herein in its entirety.

TECHNICAL FIELD

The disclosure relates to an electronic device including a bracket formed of a metal material. More particularly, the disclosure relates to an electronic device including brackets formed of different metal materials according to structural characteristics of the electronic device.

BACKGROUND ART

Due to the remarkable development of information communication technology, semiconductor technology, and the like, the distribution and use of various electronic devices are rapidly increasing. More particularly, recent electronic devices are being developed such that users are capable of communicating with each other while carrying the electronic devices.

Typically, an electronic device may mean a device that performs a specific function according to a program provided therein (e.g., an electronic scheduler, a portable multimedia reproducer, a mobile communication terminal, a tablet PC, an image/sound device, a desktop/laptop PC, or a vehicle navigation system), as well as a home appliance. The above-mentioned electronic devices may output, for example, information stored therein as sound or an image. As the degree of integration of electronic devices has increased and ultra-high-speed and large-capacity wireless communication has become popular, multiple functions have recently come to be provided in a single electronic device, such as a mobile communication terminal. For example, various functions, such as an entertainment function (e.g., a game function), a multimedia function (e.g., a music/video reproducing function), a communication and security function (e.g., mobile banking), a schedule management function, and an e-wallet function, are integrated in a single electronic device, in addition to a communication function. Such an electronic device is being miniaturized so that a user can conveniently carry the electronic device.

Recently, a portable electronic device, such as a smartphone may include housing structures having different structures based on a hinge structure, including a flexible display. Accordingly, measures for satisfying conditions required according to the structural characteristics of each housing structure of the electronic device may be considered.

The above information is presented as background information only to assist with an understanding of the disclosure. No determination has been made, and no assertion is made, as to whether any of the above might be applicable as prior art with regard to the disclosure.

DETAILED DESCRIPTION OF THE INVENTION

Technical Problem

An electronic device including a flexible display may include housing structures having different structures based on a hinge structure. For example, one housing structure includes a printed circuit board on which a plurality of heating elements are stacked, so the thermal conductivity of a metal material constituting a bracket that supports the printed circuit board may be important, and the other housing structure includes a sub-display, so the specific gravity of a metal material constituting a bracket that supports the sub-display may be important.

Aspects of the disclosure are to address at least the above-mentioned problems and/or disadvantages and to provide at least the advantages described below. Accordingly, an aspect of the disclosure is to provide an electronic device including brackets formed of different metal materials according to structural characteristics of the electronic device.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a foldable housing including a hinge structure, a first housing connected to the hinge structure and including a first side wall structure and a first bracket located inside the first side wall structure, and a second housing connected to the hinge structure and including a second side wall structure and a second bracket located inside the second side wall structure, the second housing being folded with the first housing about the hinge structure, a display panel extending from the first housing to the second housing across the hinge structure and configured to output a screen, and a second antenna structure including a second ground and a second feeding portion disposed on the second side wall structure of the second housing, wherein the first side wall structure of the first housing and the second side wall structure of the second housing may include a first metal material, and the first bracket of the first housing includes the first metal material, and the second bracket of the second housing may include a second metal material.

Advantageous Effects

In an electronic device according to various embodiments of the disclosure, based on the hinge structure, the side wall structure and the bracket included in the housing structure in which a heat source is mounted are formed of the same metal material having high thermal conductivity, and the side wall structure and the bracket included in the housing structure in which a heat source is not mounted are at least partially formed of a metal material having a low specific gravity. Thus, it is possible to reduce the weight of the electronic device.

In the electronic device according to various embodiments of the disclosure, it is possible to transfer heat generated by an electronic component to the outside of a hinge module or the electronic device.

In addition, various effects directly or indirectly understood through this document can be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR CARRYING OUT THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
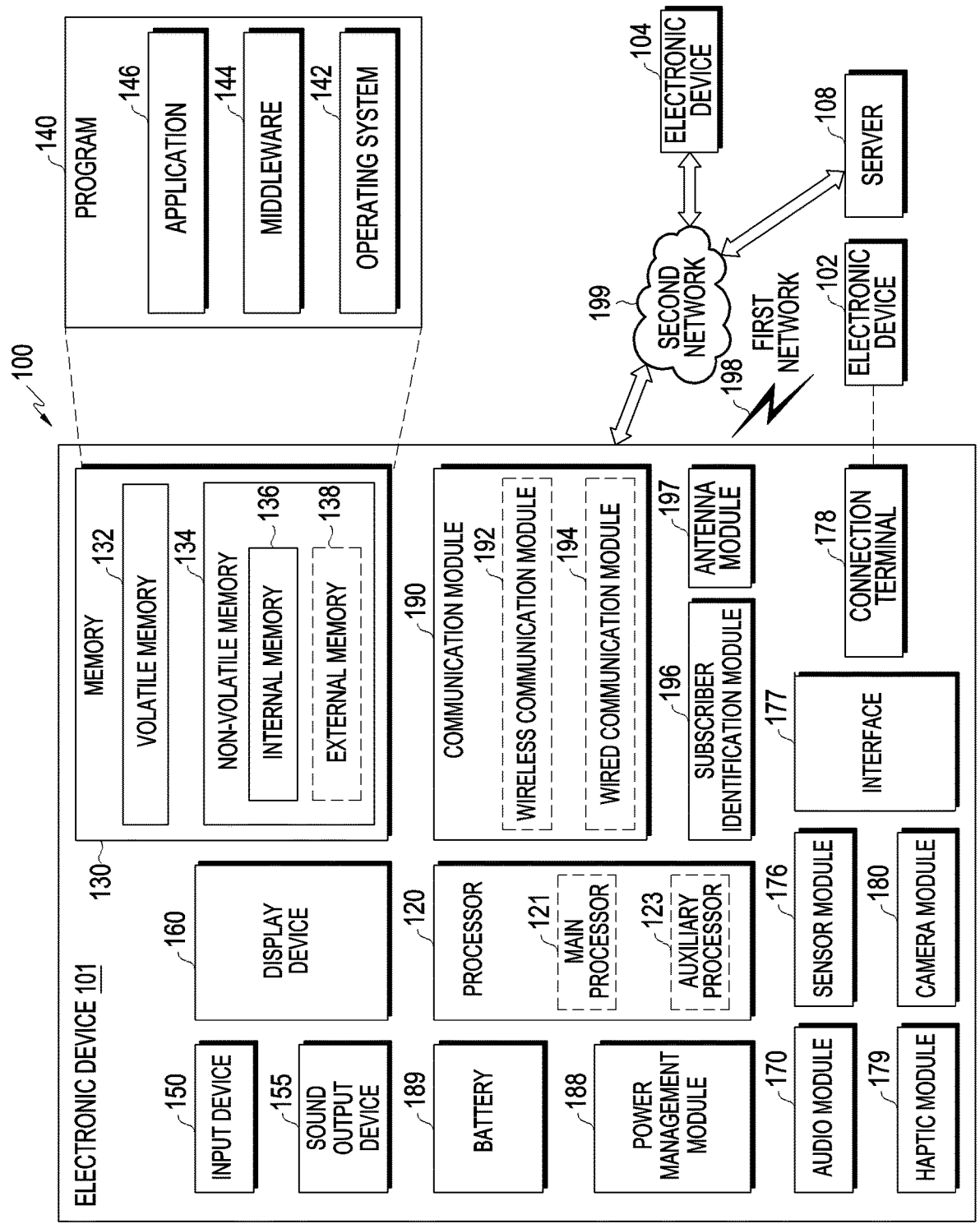
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or an external electronic device 104 or a server 108 via a second network 199 (e.g., a long-range wireless communication network). According to an embodiment of the disclosure, the electronic device 101 may communicate with the external electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., the external electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

The antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more external devices of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
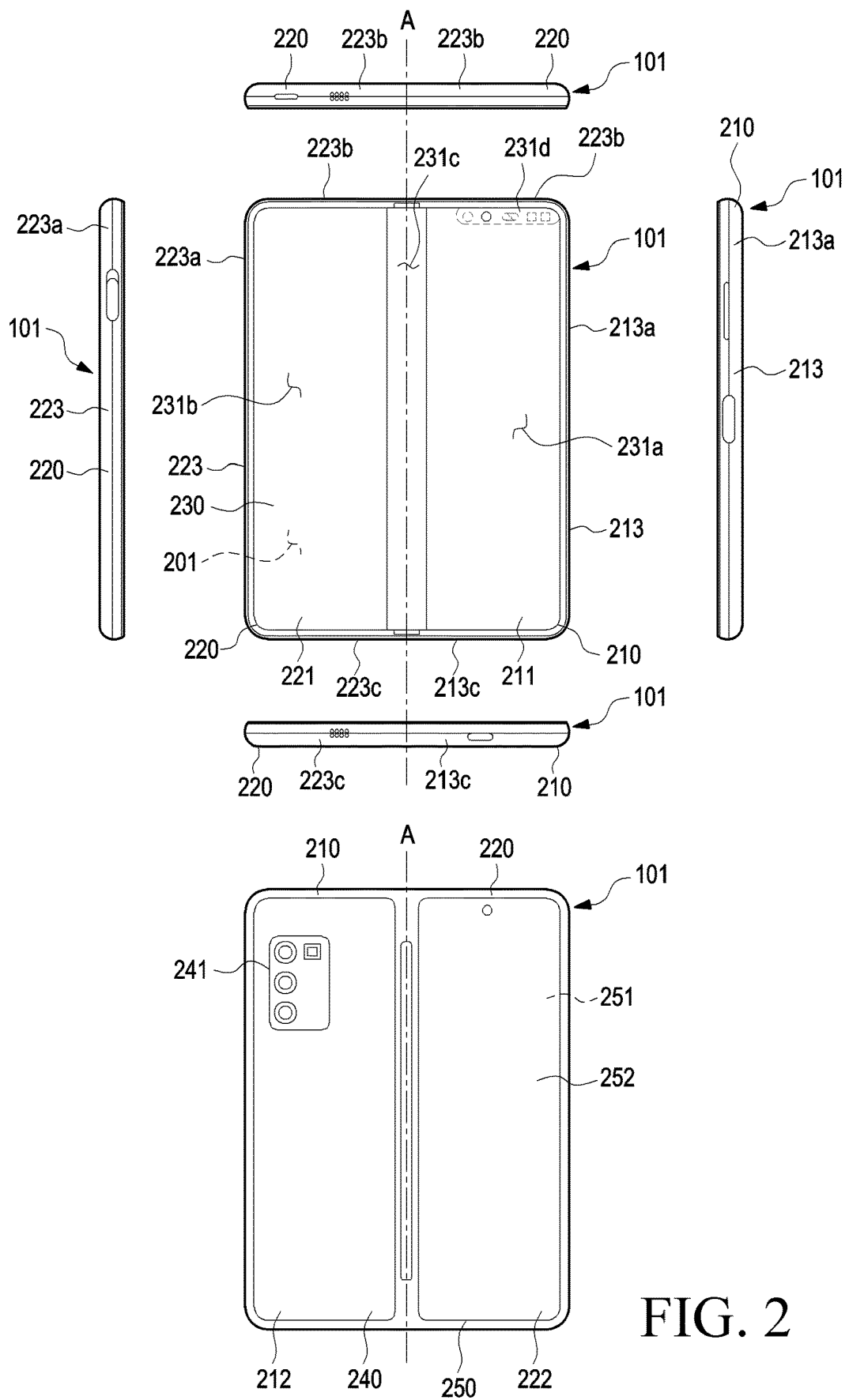
FIG. 2 is a view illustrating an electronic device in an unfolded state according to an embodiment of the disclosure.
Figure 3:
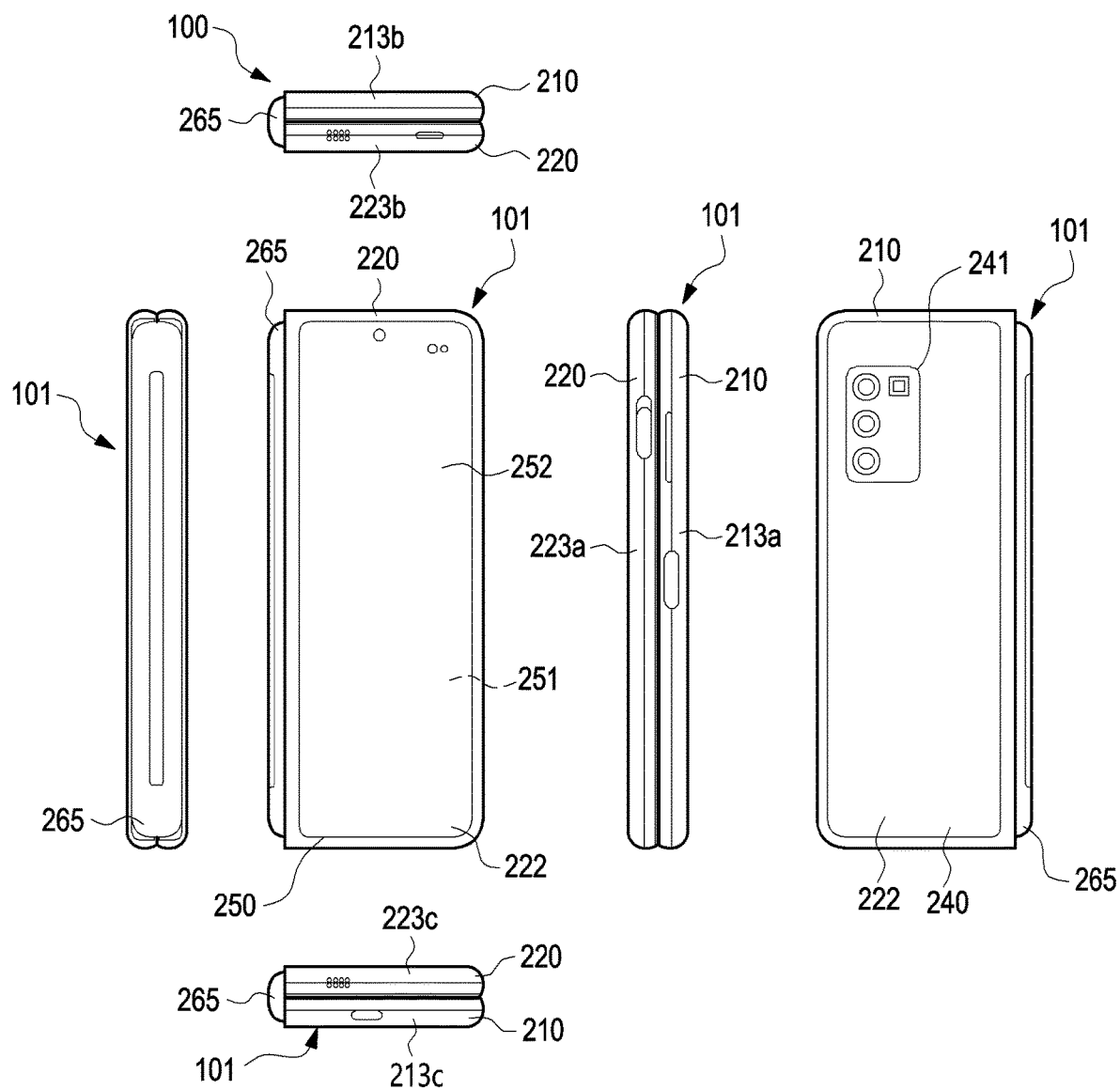
FIG. 3 is a view illustrating an electronic device of FIG. 2 in a folded state according to an embodiment of the disclosure.

FIG. 2 is a view illustrating an electronic device in an unfolded state according to an embodiment of the disclosure. FIG. 3 is a view illustrating an electronic device of FIG. 2 in a folded state according to an embodiment of the disclosure.

In the following detailed description, a pair of housing structures (or referred to as "housings") may be exemplified with respect to a configuration in which the housing structures are rotatably coupled to each other by a hinge structure (or, referred to as a "hinge module"). However, it should be noted that these embodiments do not limit an electronic device according to various embodiments of the disclosure. For example, an electronic device according to various embodiments of the disclosure may include three or more housing structures, and "a pair of housing structures" in the embodiments disclosed below means "two housing structures rotatably coupled to each other among three or more housing structures".

Referring to FIGS. 2 and 3, an electronic device 101 (e.g., the electronic device 101 in FIG. 1) may include a pair of housing structures 210 and 220 rotatably coupled to each other via a hinge structure (e.g., a hinge structure 264 in FIG. 4) so as to be folded with respect to each other, a hinge cover 265 that covers the foldable portions of the pair of housing structures 210 and 220, and a display 230 (e.g., a flexible display or a foldable display) disposed in a space defined by the pair of housing structures 210 and 220. According to an embodiment, the electronic device 101 may include a foldable housing in which the pair of housing structures 210 and 220 are coupled to be rotatable from a position at which the pair of housing structures 110 and 120 are folded to face each other to a position at which the pair of housing structures 210 and 220 are unfolded to be parallel to each other. The surface on which the display 230 according to various embodiments of the disclosure is may be defined as the front surface of the electronic device 101, and the surface opposite to the front surface may be defined as the rear surface of the electronic device 101. In addition, the surface surrounding the space between the front surface and the rear surface may be defined as the side surface of the electronic device 101.

According to an embodiment, the pair of housing structures 210 and 220 may include a first housing structure 210 including a sensor region 231d, a second housing structure 220, a first rear cover 240, and a second rear cover 250. The pair of housing structures 210 and 220 of the electronic device 101 are not limited to the shape and assembly illustrated in FIGS. 2 and 3, but may be implemented by other combinations and/or assemblies of other shapes or components. For example, according to another embodiment, the first housing structure 210 and the first rear cover 240 may be integrally configured, and the second housing structure 220 and the second rear cover 250 may be integrally configured. In another embodiment, the first housing structure 210 may include a first rear cover 240, and the second housing structure 220 may include a second rear cover 250.

According to an embodiment, the first housing structure 210 and the second housing structure 220 may be disposed on opposite sides about a folding axis A, and may have generally symmetrical shapes with respect to the folding axis A. According to some embodiments, the first housing structure 210 and the second housing structure 220 are rotatable with respect the hinge structure 264 or the hinge cover 265 about different folding axes. For example, the first housing structure 210 and the second housing structure 220 may be coupled to the hinge structure 264 or the hinge cover 265 to be individually rotatable. Since the first housing structure 210 and the second housing structure 220 rotate about the folding axis A or about different folding axes, respectively, the first housing structure and the second housing structure are rotatable between the positions at which the first housing structure and the second housing structure are folded to each other and the positions at which the first housing structure and the second housing structure are inclined with respect to each other or the positions at which the first housing structure and the second housing structure are unfolded to be parallel to each other.

In the disclosure, the wording "positioned side by side" or "extending side by side" may mean the state in which two structures (e.g., the housing structures 210 and 220) are at least partially positioned next to each other or the state in which at least portions positioned next to each other are arranged parallel to each other. According to some embodiments, the wording "arranged side by side" may mean that the two structures are arranged to look in parallel or in the same direction while being located next to each other. Expressions such as "side by side", "parallel", and the like may be used in the following detailed description, which will be readily understood according to the shapes or arrangements of the structures with reference to the accompanying drawings.

According to an embodiment, the angle or distance between the first housing structure 210 and the second housing structure 220 may vary depending on whether the electronic device 101 is in the unfolded state (an extended state, a flat state or an open state), in the folded state (or a closed), or in the intermediate state. In describing various embodiments of the disclosure, when the state of the electronic device 101 is the "unfolded state", it may mean that the electronic device 101 is in a "fully unfolded state" in which the first housing structure 210 and the second housing structure 220 of the electronic device 101 form 180 degrees therebetween. When the state of the electronic device 101 is the "closed state", it may mean that the electronic device 101 is in the state in which the first housing structure 210 and the second housing structure 220 of the electronic device 101 form an angle of 0 degrees or less than 10 degrees therebetween. When the state of the electronic device 101 is the "intermediate state", it means that the angle between the first housing structure 210 and the second housing structure 220 forms an angle between the angle formed in the "unfolded state" and the angle formed in the "closed state".

According to an embodiment, unlike the second housing structure 220, the first housing structure 210 may further include the sensor region 324 in which various sensors are disposed. However, the first housing structure 210 and the second housing structure 220 may have mutually symmetrical shapes in other regions. According to another embodiment, the sensor region 231d may be additionally disposed or replaced in at least a partial region of the second housing structure 220. According to another embodiment, the sensor region 231d may be omitted from the first housing structure 210.

According to an embodiment, in the unfolded state of the electronic device 101, the first housing structure 210 may include a first surface 211 connected to a hinge structure (e.g., the hinge structure 264 in FIG. 4) and arranged to face the front side of the electronic device 101, a second surface 212 facing away from the first surface 211, and a first side wall structure 213 surrounding at least a portion of the space between the first surface 211 and the second surface 212. According to an embodiment, the first side wall structure 213 may include a first side wall 213a arranged in parallel to the folding axis A, a second side wall 213b extending from one end of the first side wall 213a in a direction perpendicular to the folding axis A, and a third side wall 213c extending from the other end of the first side wall 213a in a direction perpendicular to the folding axis A. In describing various embodiments, expressions such as "parallel" or "perpendicular" are used in connection with the arrangements of the above-described side faces, but in some embodiments, the expressions may include the meaning of "partially parallel" or "partially perpendicular". In some embodiments, expressions such as "parallel" or "perpendicular" may include an inclined arrangement relationship in an angular range within 10 degrees.

According to an embodiment, in the unfolded state of the electronic device 101, the second housing structure 220 may include a third surface 221 connected to the hinge structure (e.g., the hinge structure 260 in FIG. 4) and arranged to face the front side of the electronic device 101, a fourth surface 222 facing away from the third surface 221, and a second side wall structure 223 surrounding at least a portion of the space between the third surface 221 and the fourth surface 222. According to an embodiment, the second side wall structure 223 may include a fourth side wall 223a arranged in parallel to the folding axis A, a fifth side wall 223b extending from one end of the fourth side wall 223a in a direction perpendicular to the folding axis A, and a sixth side wall 223c extending from the other end of the fourth side wall 223a in a direction perpendicular to the folding axis A. According to an embodiment, in the folded state, the third surface 221 may be disposed to face the first surface 211. According to some embodiments, although there are some differences in specific shape, the second side wall structure 223 may be manufactured in substantially the same shape or made of substantially the same material as the first side wall structure 213.

According to an embodiment, the electronic device 101 may include a recess 201 defined to accommodate the display 230 through structural shape coupling between the first housing structure 210 and the second housing structure 220. The recess 201 may have substantially the same size as the display 230.

According to an embodiment, at least a portion of the first housing structure 210 and at least a portion of the second housing structure 220 may be formed of a metal material or a non-metal material having rigidity, the level of which is selected in order to support the display 230. According to another embodiment, the first housing structure 210 and the second housing structure 220 may at least partially include a conductive material. When the first housing structure 210 and the second housing structure 220 include a conductive material, the electronic device 101 may transmit/receive radio waves by using the portions formed of the conductive material in the first housing structure 210 and the second housing structure 220. For example, a processor or a communication module of the electronic device 101 may perform wireless communication using a portion of each of the first housing structure 210 and the second housing structure 220.

According to an embodiment, the sensor region 231d may be disposed in the display 230 to have a predetermined region without a separate notch adjacent to one corner of the first housing structure 210. However, the arrangement, shape, and size of the sensor region 231d is not limited to the illustrated example. For example, in another embodiment, the sensor region 231d may be provided at another corner of the first housing structure 210 or in any region between the upper and lower end corners. According to another embodiment, the sensor region 231d may be disposed in at least a partial region of the second housing structure 220. According to another embodiment, the sensor region 231d may be disposed to extend over the first housing structure 210 and the second housing structure 220. According to an embodiment, the electronic device 101 may include components exposed to the front surface of the electronic device 101 through the display 230 or through one or more openings provided in the display 230, and may perform various functions by using these components. For example, a front camera device disposed in the sensor region 231d may be exposed on the front surface of the electronic device 101 through the one or more openings provided in the display 230. However, the disclosure is not necessarily limited to this embodiment, and at least one of the other components disposed in the sensor region 231d, for example, a proximity sensor, an illuminance sensor, an iris recognition sensor, an ultrasonic sensor, or an indicator, may be exposed on the front surface of the electronic device 101. The sensor region 231d may be omitted according to an embodiment, and according to this, the components disposed in the sensor region 231d may be distributed and disposed in at least a portion of the first housing structure 210 and/or at least a portion of the second housing structure 220.

According to an embodiment, the first rear cover 240 may be disposed on the second face 212 of the first housing structure 210, and may have a substantially rectangular periphery. According to an embodiment, the periphery of the first rear cover 240 may be at least partially wrapped by the first housing structure 210. Similarly, the second rear cover 250 may be disposed on the fourth surface 222 of the second housing structure 220, and at least a portion of the periphery of the second rear cover 250 may be at least partially enclosed by the second housing structure 220.

According to the illustrated embodiment, the first rear cover 240 and the second rear cover 250 may have substantially symmetrical shapes with respect to the folding axis A. According to another embodiment, the first rear cover 240 and the second rear cover 250 may have various different shapes. According to a still another embodiment, the first rear cover 240 may be formed integrally with the first housing structure 210, and the second rear cover 250 may be formed integrally with the second housing structure 220.

According to an embodiment, the first rear cover 240, the second rear cover 250, the first housing structure 210, and the second housing structure 220 may provide, through a mutually coupled structure, a space in which various components (e.g., a printed circuit board, an antenna module, a sensor module, or a battery) of the electronic device 101 may be disposed. According to an embodiment, one or more components may be disposed or visually exposed on the rear surface of the electronic device 101. For example, one or more components or sensors may be visually exposed through a first rear region 241 of the first rear cover 240. According to various embodiments, the sensors may include a proximity sensor, a rear camera device, and/or a flash. In an embodiment, at least a portion of the sub-display 252 may be visually exposed through a second rear region 251 of the second rear cover 250. For example, the sub-display 252 may include the entire second rear region 251 of the second rear cover 250.

The display 230 may be disposed in a space defined by the pair of housing structures 210 and 220. For example, the display 230 may be seated in the recess (e.g., the recess 201 in FIG. 2) defined by the pair of housing structures 210 and 220, and may be disposed to occupy substantially the majority of the front surface of the electronic device 101. For example, the front surface of the electronic device 101 may include the display 230, and a partial region (e.g., a peripheral region) of the first housing structure 210 and a partial region (e.g., a peripheral region) of the second housing structure 220, which are adjacent to the display 230. According to an embodiment, the rear surface of the electronic device 101 may include a first rear cover 240, a partial region (e.g., a peripheral region) of the first housing structure 210 adjacent to the first rear cover 240, a second rear cover 250, and a partial region (e.g., a peripheral region) of the second housing structure 220 adjacent to the second rear cover 250.

According to an embodiment, the display 230 may refer to a display, at least a portion of which is deformable into a planar surface or a curved surface. According to an embodiment, the display 230 may include a folding region 231c, a first region 231a disposed on one side of the folding region 231c (e.g., the right region of the folding region 231c), and a second region 231b disposed on the other side of the folding region 231c (e.g., the left region of the folding region 231c). For example, the first region 231a may be disposed in the first surface 211 of the first housing structure 210, and the second region 231b may be disposed in the third surface 221 of the second housing structure 220. For example, the display 230 may extend from the first surface 211 to the third surface 221 across the hinge structure 264 in FIG. 4, and at least a region corresponding to the hinge structure 264 (e.g., the folding region 231c) may be a flexible region that is deformable from a flat plate shape into a curved shape.

According to an embodiment, the region division of the display 230 is exemplary, and the display 230 may be divided into multiple regions (e.g., four or more regions or two regions) depending on the structure or functions thereof. For example, in the embodiment illustrated in FIG. 2, the folding region 231c extends in the direction of the vertical axis (e.g., the Y axis in FIG. 4) parallel to the folding axis A, and the region of the display 230 may be divided by the folding region 231c or the folding axis (the axis A). However, according another embodiment, the region of the display 230 may be divided with reference to another folding region (e.g., a folding region parallel to the horizontal axis (e.g., the X axis in FIG. 4)) or another folding axis (e.g., a folding axis parallel to the X axis in FIG. 4). The aforementioned region division of the display is merely physical division based on the pair of housing structures 210 and 220 and the hinge structure (e.g., the hinge structure 264 in FIG. 4), and the display 230 may display one full screen substantially through the pair of housing structures 210 and 220 and the hinge structure (e.g., the hinge structure 264 in FIG. 4). According to an embodiment, the first region 231a and the second region 231b may have generally symmetrical shapes about the folding region 231c.

Figure 4:
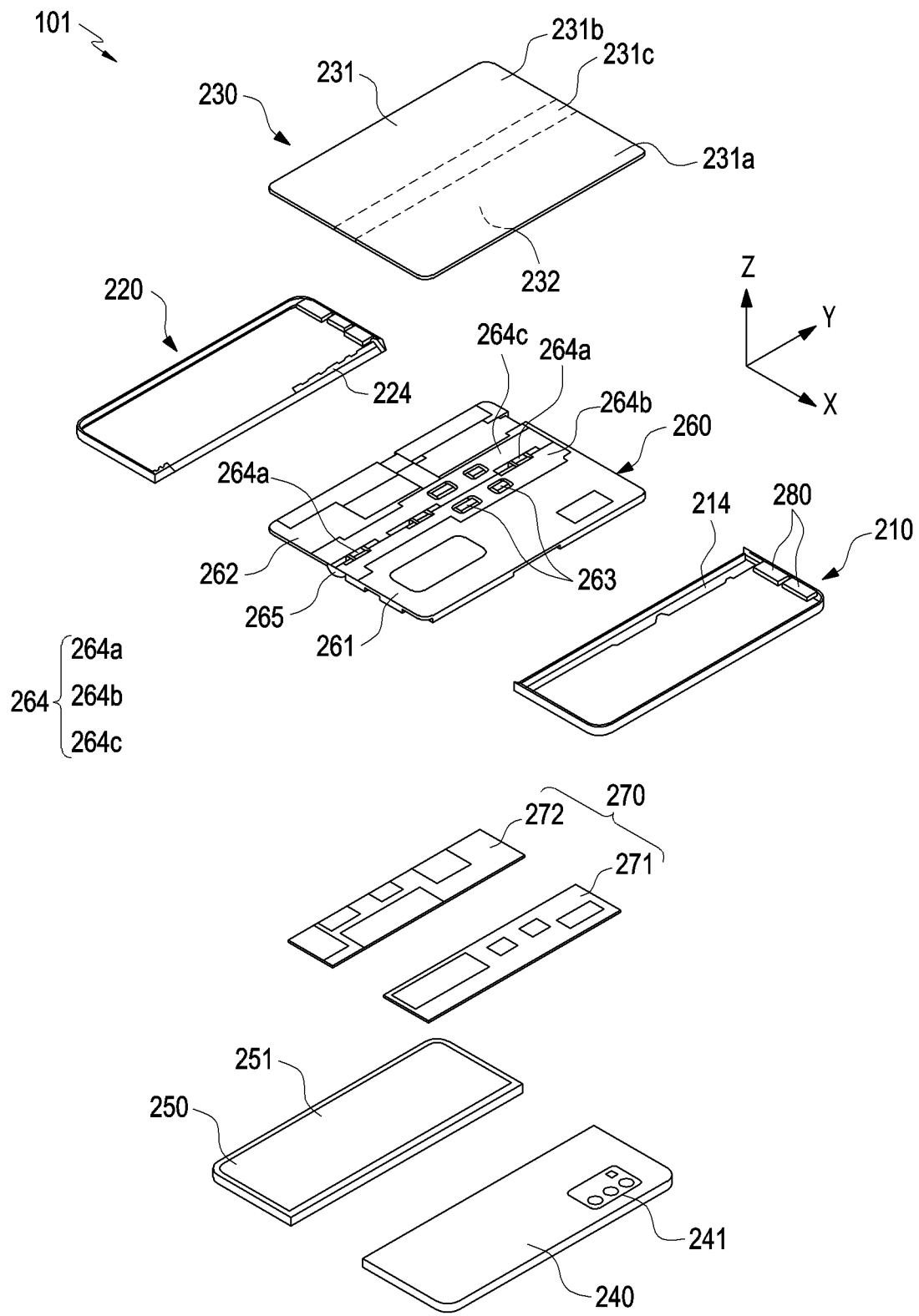
FIG. 4 is an exploded perspective view of an electronic device according to an embodiment of the disclosure.

Further referring to FIGS. 2 and 3, the hinge cover 265 may be disposed between the first housing structure 210 and the second housing structure 220 to cover internal components (e.g., the hinge structure 264 in FIG. 4). According to an embodiment, the hinge cover 265 may be covered by a portion of each of the first and second housing structures 210 and 220 or may be exposed to the outside depending on the operating state of the electronic device 101 (the unfolded state or the folded state).

Hereinafter, the operations of the first housing structure 210 and the second housing structure 220 and respective regions of the display 230 depending on the operating state of the electronic device 101 (e.g., the unfolded state (extended state) and the folded state) will be described.

According to an embodiment, when the electronic device 101 is in the unfolded state (extended state) (e.g., the state in FIG. 2), the first housing structure 210 and the second housing structure 220 may form an angle of 180 degrees therebetween, and the first region 231a and the second region 231b of the display may be disposed to face the same direction, for example, to display screens in directions parallel to each other. In addition, the folding region 231c may form the same plane as the first region 231a and the second region 232b.

According to an embodiment, when the electronic device 101 is in the folded state (e.g., the state of FIG. 3), the first housing structure 210 and the second housing structure 220 may be disposed to face each other. For example, when the electronic device 101 is in the folded state (e.g., the state of FIG. 3), the first region 231a and the second region 231b of the display 230 may form a narrow angle (e.g., 0 to 10 degrees) therebetween and may face each other. When the electronic device 101 is in the folded state (e.g., the state of FIG. 3), at least a portion of the folding region 231c may form a curved surface having a predetermined curvature.

According to an embodiment, when the electronic device 101 is in the intermediate state, the first housing structure 210 and the second housing structure 220 may be disposed to form therebetween a predetermined angle of, for example, 90 degrees or 120 degrees. For example, in the intermediate state, the first region 231a and the second region 231b of the display 230 may form an angle larger than that in the folded state and smaller than that in the unfolded state. At least a portion of the folding region 231c may be formed as a curved surface having a predetermined curvature, and the curvature in this case may be smaller than that in the folded state.

FIG. 4 is an exploded perspective view of an electronic device according to an embodiment of the disclosure.

FIG. 4 illustrates a direction component X, a direction component Y, and a direction component Z. According to an embodiment of the disclosure, the direction component X, the direction component Y, and the direction component Z may represent, respectively, the X axis, the Y axis, and the Z axis of a spatial coordinate system. In various embodiments of the disclosure, the X axis may indicate the width direction of the electronic device, the Y axis may indicate the length direction of the electronic device of the electronic device, and the Z axis may indicate the height direction (or thickness direction) of the electronic device.

Referring to FIG. 4, according to an embodiment, the electronic device 101 (e.g., the electronic device 101 in FIGS. 1 to 3) may include a display 230, a bracket assembly 260, at least one printed circuit board 270 (e.g., a PCB, a flexible PCB (FPCB), or a rigid flexible PCB (RFPCB)), a first housing structure 210, a second housing structure 220, a first rear cover 240, and a second rear cover 250. The display 230 according to various embodiments of the disclosure may be referred to as a display module (e.g., the display module 160 in FIG. 1) or a display assembly.

The display 230 may include a display panel 231 (e.g., a flexible display panel), and at least one plate 232 or layer on which the display panel 231 is seated. According to an embodiment, the plate 232 may be disposed between the display panel 231 and the bracket assembly 260. According to an embodiment, the plate 232 may configure at least a portion of the first housing structure 210 and the second housing structure 220. The display panel 231 may be disposed on at least a portion of one surface (e.g., the surface in the Z direction in FIG. 4) of the plate 232. The plate 232 may be formed in a shape corresponding to that of the display panel 231.

The bracket assembly 260 may include a first bracket 261, a second bracket 262, a hinge structure 264 disposed between the first bracket 261 and the second bracket 262, a hinge cover 265 configured to cover the hinge structure 264 when the hinge structure 264 is viewed from the outside, and a wiring member 263 (e.g., a flexible printed circuit board (FPCB)) extending across the first and second brackets 261 and 262.

According to an embodiment, the bracket assembly 260 may be disposed between the plate 232 and the at least one printed circuit board 270. For example, the first bracket 261 may be disposed between the first region 231a of the display 230 and a first printed circuit board 271. The second bracket 262 may be disposed between the second region 231a of the display 230 and a second printed circuit board 272.

According to an embodiment, at least a portion of the wiring member 263 and the hinge structure 264 may be disposed inside the bracket assembly 260. The wiring member 263 may be disposed in a direction across the first bracket 261 and the second bracket 262 (e.g., the x-axis direction). The wiring member 263 may be disposed in a direction perpendicular to the folding axis (e.g., the Y axis or the folding axis A in FIG. 2) of the folding region 231c (e.g., the X-axis direction).

According to various embodiments, the hinge structure 264 may include a hinge module 264a, a first hinge plate 264b, and/or a second hinge plate 264c. According to some embodiments, the hinge module 264a may be interpreted as including the first hinge plate 264b and the second hinge plate 264c. According to an embodiment, the first hinge plate 264b may be mounted inside the first housing structure 210, and the second hinge plate 264c may be mounted inside the second housing structure 220. According to some embodiments, the first hinge plate 264b may be coupled to the first bracket 261, and the second hinge plate 264c may be coupled to the second bracket 262. According to another embodiment, the first hinge plate 264b (or the second hinge plate 264c) may be coupled to another structure (e.g., a first rotation support surface 214 or a second rotation support surface 224) inside the first housing structure 210 (or the second housing structure 220). For example, the structure to which the first hinge plate 264b (or the second hinge plate 264c) is coupled inside the first housing structure 210 (or the second housing structure 220) may vary according to embodiments. According to another embodiment, the hinge module 264a may be coupled to the first hinge plate 264b and the second hinge plate 264c to rotatably connect the second hinge plate 264c to the first hinge plate 264b. For example, a folding axis (e.g., the folding axis A in FIG. 2) is provided by the hinge module 264a, and the first housing structure 210 and the second housing structure 220 (or the first bracket 261 and the second bracket 262) may rotate with respect to each other substantially about the folding axis A.

As described above, the at least one printed circuit board 270 may include a first printed circuit board 271 disposed on the first bracket 261 side and a second printed circuit board 272 disposed on the second bracket 262 side. The first printed circuit board 271 and the second printed circuit board 272 may be disposed inside a space defined by the bracket assembly 260, the first housing structure 210, the second housing structure 220, the first rear cover 240, and the second rear cover 250. Components for implementing various functions of the electronic device 101 may be mounted on the first printed circuit board 271 and the second printed circuit board 272.

According to an embodiment, the first housing structure 210 and the second housing structure 220 may be assembled so as to be coupled to the opposite sides of the bracket assembly 260 in the state in which the display 230 is coupled to the bracket assembly 260. The first housing structure 210 and the second housing structure 220 may be slidably coupled to the opposite sides of the bracket assembly 260, for example, to the first bracket 261 and the second bracket 262, respectively. The first bracket 261 and the second bracket 262 are substantially accommodated in the first housing structure 210 and the second housing structure 220. According to an embodiment, the first bracket 261 and the second bracket 262 may be interpreted as portions of the first housing structure 210 and the second housing structure 220, respectively.

According to an embodiment, the first housing structure 210 may include a first rotation support surface 214, and the second housing structure 220 may include a second rotation support surface 224, which corresponds to the first rotation support structure 214. The first rotation support surface 214 and the second rotation support surface 224 may include curved surfaces corresponding, respectively, to curved surfaces included in the hinge cover 265. According to an embodiment, the first housing structure 210 may include at least one of a plurality of components 280 disposed in the sensor region 231d of FIGS. 2 and 3 (e.g., a front camera device, a proximity sensor, an illuminance sensor, an iris recognition sensor, an ultrasonic sensor, or an indicator).

In an embodiment, when the electronic device 101 is in the unfolded state (e.g., the state of FIG. 2), the first rotation support surface 214 and the second rotation support surface 224 cover the hinge cover 265, so that the hinge cover 265 may not be exposed or may be minimally exposed to the rear surface of the electronic device 101. In an embodiment, when the electronic device 101 is in the unfolded state (e.g., the state of FIG. 3), the first rotation support surface 214 and the second rotation support surface 224 rotate, respectively, along the curved surfaces included in the hinge cover 265, so that the hinge cover 265 can be maximally exposed to the rear surface of the electronic device 101.

In the foregoing detailed description, in the first housing structure 210, the second housing structure 220, the first side wall structure 213, the second side wall structure 223, and the like, ordinal numbers are used merely to distinguish components. It is noted that the disclosure is not limited by the description of the ordinal numbers. For example, although the sensor region 231d is illustrated as being provided in the first housing structure 210, the sensor region 231d may be provided in the second housing structure 220 or may be provided in both the first and second housing structures 210 and 220. In another embodiment, a configuration in which the first rear region 241 and the sub-display 252 are disposed on the first rear cover 240 and the second rear cover 250, respectively, is exemplified, but both the first rear region 241 for disposing a sensor or the like and the sub-display 252 for outputting a screen may be disposed on one of the first rear cover 240 and the second rear cover 250.

Figure 5:
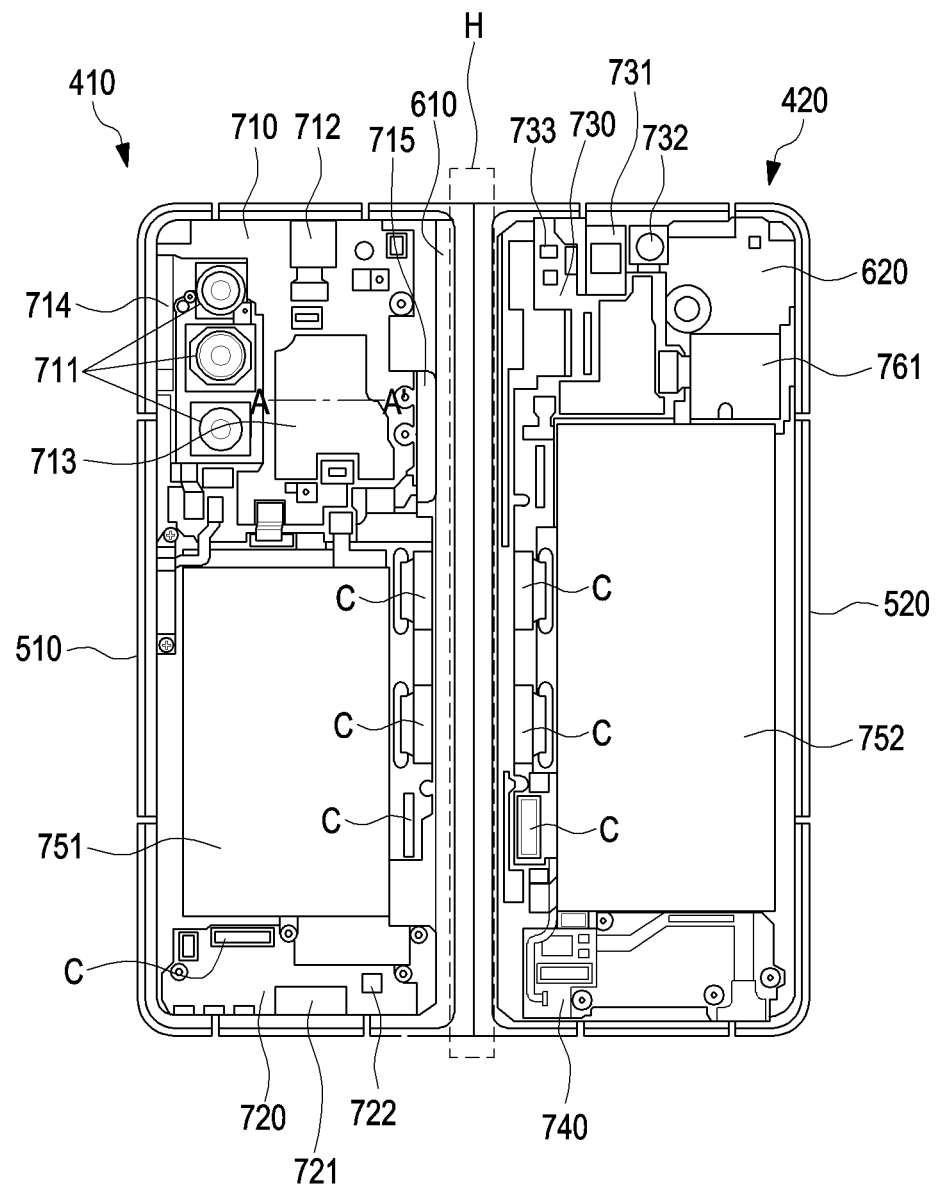
FIG. 5 is a projection view illustrating an internal structure of an electronic device in an unfolded state according to an embodiment of the disclosure.
Figure 6:
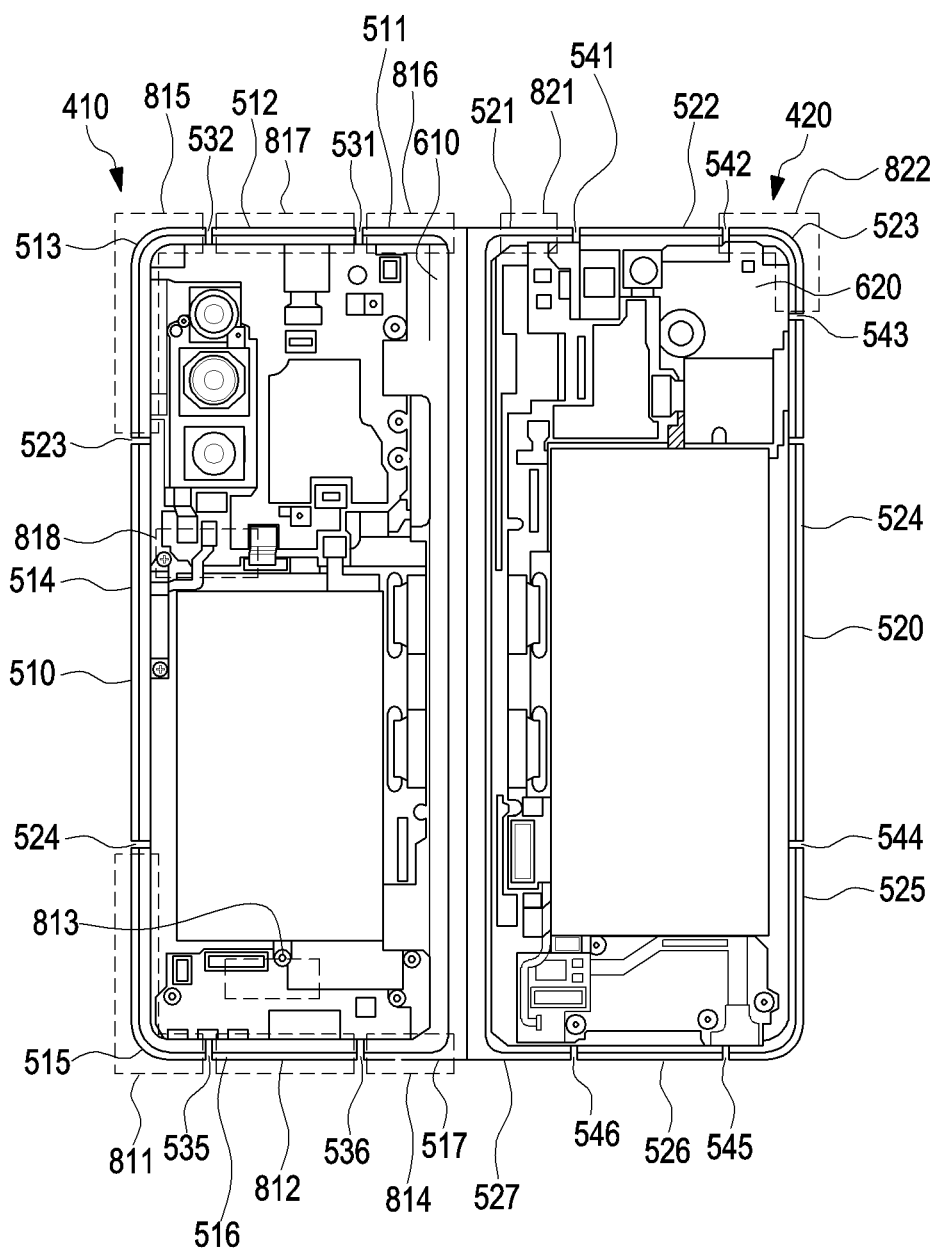
FIG. 6 is a view illustrating an antenna structure of an electronic device of FIG. 5 in a folded state according to an embodiment of the disclosure.
Figure 7:
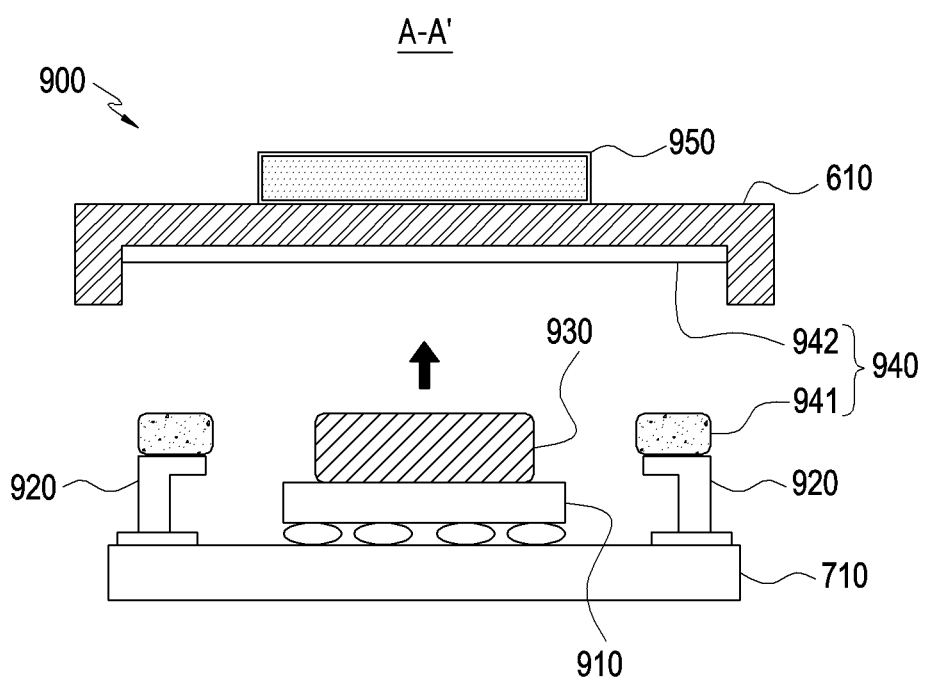
FIG. 7 is a cross-sectional view of an electronic device of FIG. 5, taken in a direction A-A' in FIG. 5 according to an embodiment of the disclosure.

FIG. 5 is a projection view illustrating an internal structure of an electronic device in a unfolded state according to an embodiment of the disclosure. FIG. 6 is a view illustrating an antenna structure of an electronic device of FIG. 5 according to an embodiment of the disclosure. FIG. 7 is a cross-sectional view of an electronic device of FIG. 5, taken in the direction A-A' in FIG. 5 according to an embodiment of the disclosure.

Referring to FIG. 5, the electronic device 101 (e.g., the electronic device 101 in FIGS. 1 to 4) may be provided with a foldable housing including a folding region H so that the electronic device 101 is substantially folded about a folding axis, wherein the foldable housing includes a first side wall structure 510 (e.g., the first side wall structure 213 in FIG. 4) included in a first housing structure 410 (e.g., the first housing structure 210 in FIGS. 2 to 4) and a second side wall structure 520 (e.g., the second side wall structure 223 in FIGS. 2 to 4) included in a second housing structure 420 (e.g., the second housing structure 220 in FIGS. 2 to 4).

The foldable housing includes at least one printed circuit board (e.g., the at least one printed circuit board 270 in FIG. 4). According to an embodiment, in a region or space of the first housing structure 410 that is surrounded by the first side wall structure 510, a first printed circuit board 710 (e.g., the first printed circuit board 271 in FIG. 4) and a second printed circuit board 720 (e.g., the first printed circuit board 271 in FIG. 4) may be accommodated. According to an embodiment, in a region or space of the second housing structure 420 that is surrounded by the second side wall structure 520, a third printed circuit board 730 (e.g., the second printed circuit board 272 in FIG. 4) and a fourth printed circuit board 740 (e.g., the second printed circuit board 272 in FIG. 4) may be accommodated.

According to an embodiment, the first printed circuit board 710 may be a main PCB that includes a processor 713 (e.g., the processor 120 in FIG. 1), a power management module (e.g., a PMIC), a charger IC, a wireless communication circuit, or a wireless transceiver (a radio frequency transceiver). According to an embodiment, the first printed circuit board 710 may further include a first communication device 714 and/or a second communication device 715. According to another embodiment, the first communication device 714 and/or the second communication device 715 may be provided in a separate module form. For example, the first communication device 714 and/or the second communication device 715 may be a mmWave communication device that performs wireless communication in a frequency band of 20 GHz or higher and 100 GHz or lower. According to an embodiment, the processor 713 may include at least a communication processor (CP) or a component in which an application processor (AP) and a communication processor are integrated, and may control or drive a wireless transceiver, a power management module, a wireless communication circuit, or the like. According to an embodiment, the wireless transceiver may communicate with the processor 713 with a transmission/reception signal and/or a control signal. In another embodiment, the wireless transceiver may be included in the third printed circuit board 730 included in the second housing structure 420. According to an embodiment, the second printed circuit board 720 may be a universal serial bus (USB) port 721, a speaker device, or a sub-PCB including an antenna. According to an embodiment, the speaker device or the antenna may be provided in the form of a separate module and connected to the second printed circuit board 720.

According to an embodiment, various components (e.g., a first camera device 711 and a second camera device 712) may be additionally provided on the first printed circuit board 710, and various components (e.g., a microphone 722) may be additionally provided to the second printed circuit board 720 as well. In some embodiments, the camera devices 711 and 712 may be disposed adjacent to the first printed circuit board 710 in the state being separated from the first printed circuit board 710. It should be noted that the number and arrangement of various components in various embodiments of the disclosure are not limited to the embodiment illustrated in FIG. 5 and may be set variously according to an embodiment.

According to an embodiment, the third printed circuit board 730 may be a main PCB including a third communication device 733. According to another embodiment, the third communication device 733 may be provided in the form of a separate module. For example, the third communication device 733 may be a Wi-Fi communication device that performs wireless communication in a frequency band of 900 MHz, 2.4 GHz, 3.65 Hz, 4.9 to 5.0 GHz, or 5 GHz or higher. According to an embodiment, the fourth printed circuit board 740 may be a sub-PCB including a speaker device or an antenna. According to an embodiment, the speaker device or the antenna may be provided in the form of a separate module and connected to the fourth printed circuit board 740.

According to an embodiment, various components (e.g., a third camera device 732 and a receiver 731) may be additionally provided on the third printed circuit board 730, and various components may be additionally provided on the fourth printed circuit board 740 as well. In some embodiments, the third camera device 732 may be disposed adjacent to the third printed circuit board 730 in the state being separated from the third printed circuit board 730. It should be noted that the number and arrangement of various components in various embodiments of the disclosure are not limited to the embodiment illustrated in FIG. 5 and may be set variously according to an embodiment.

According to an embodiment, the printed circuit boards 710, 720, 730, and 740 may include a plurality of connectors C for electrical connection (e.g., control signal, power, or communication signal transmission) between the various components or for electrical connection among the printed circuit boards 710, 720, 730, and 740. In the plurality of connectors C included in the printed circuit boards 710, 720, 730, and 740, various types of connection structures (or connector structures), such as a flexible printed circuit (FPC) or flexible flat cable (FFC) type, a board to board (B to B) type, a zip type, a bonding type provided through a hot bar process, a low insertion force (LIF), a zero insertion force (ZIF) and the like may be adopted, and through these, relevant components may be electrically coupled to each other or respective printed circuit boards may be electrically coupled to each other.

According to an embodiment, in the electronic device 101, an electrical connection structure F (or a connector structure) of a connector to connector type (or C2C type) that interconnects two different connectors C to each other may be adopted in addition to the various types of connection structures.

According to an embodiment, the first printed circuit board 710 and the second printed circuit board 720 may be configured to be supported from a first bracket 610 (e.g., the first bracket 261 in FIG. 4) coupled to the first side wall structure 510. According to an embodiment, the third printed circuit board 730 and the fourth printed circuit board 740 may be configured to be supported from a second bracket 620 (e.g., the second bracket 262 in FIG. 4) coupled to the second side wall structure 520. According to an embodiment, the first side wall structure 510 and the first bracket 610 may be configured separably or integrally. According to an embodiment, the second side wall structure 520 and the second bracket 620 may be configured separably or integrally. According to an embodiment, the first bracket 610 may support the first printed circuit board 710 and the second printed circuit board 720, or may support other components (e.g., a battery 751) that are not mounted on the first printed circuit board 710 and the second printed circuit board 720. According to an embodiment, the second bracket 620 may support the third printed circuit board 730 and the fourth printed circuit board 740, or may support other components (e.g., a battery 752 and a SIM reader 761) that are not mounted on the third printed circuit board 730 and the fourth printed circuit board 740.

According to an embodiment, the first housing structure 410 may further include a wireless charging module (not illustrated) equipped with a wireless charging part, a near field communication (NFC) antenna, and/or a magnetic secure transmission (MST) antenna. For example, the wireless charging module may be mounted on the first battery 751 supported by the first bracket 610 in the first housing structure 410.

Referring to FIG. 6, the first housing structure 410 of the electronic device 101 includes antenna regions (e.g., a $(1-1)^{th}$ antenna region 811, a $(1-2)^{th}$ antenna region 812, a $(1-3)^{th}$ antenna region 813, a $(1-4)^{th}$ antenna region 814, a $(1-5)^{th}$ antenna region 815, a $(1-6)^{th}$ antenna region 816, a $(1-7)^{th}$ antenna region 817, and a $(1-8)^{th}$ antenna region 818 in each of which an antenna is disposed. For example, a (1-1)$^{th}$ antenna operating in an LB frequency band as a first main antenna may be disposed in the (1-1)$^{th}$ antenna region 811, a (1-2)$^{th}$ antenna operating in an MB, HB, n77, or n78 band as a second main antenna may be disposed in the (1-2)$^{th}$ antenna region 812, a (1-3)$^{th}$ antenna operating in an n41 or n79 band as a third main antenna may be disposed in the (1-3)$^{th}$ antenna region 813, and a (1-4)$^{th}$ antenna operating in an mb band as a fourth main antenna may be disposed in the (1-4)$^{th}$ antenna region 814. A (1-5)$^{th}$ antenna operating in an lb, mb, hb, or n41 frequency band as a first sub-antenna may be disposed in the (1-5)$^{th}$ antenna region 815, a (1-6)$^{th}$ antenna operating in a 77, N78, n79, LAA1, L1, mb, or hb band as a second sub-antenna may be disposed (1-6)$^{th}$ antenna region 816, a (1-7)$^{th}$ antenna operating in an N79, n77, n78, L5, or an ultra-wide (UWB9) band as a third sub-antenna may be disposed in the (1-7)$^{th}$ antenna region 817, and a (1-8)$^{th}$ antenna operating in an n77, n78, n79, or LAA2 band as a fourth sub-band may be disposed in the (1-8)$^{th}$ antenna region 818. The number of antenna regions included in the first housing structure 410 is limited to eight in FIG. 6, the number and locations of antenna regions are not limited thereto and may be changed as necessary.

According to an embodiment, the second housing structure 420 of the electronic device 101 may include antenna regions (e.g., a (2-1)$^{th}$ antenna region 821 and a (2-2)$^{th}$ antenna region 822) in each of which an antenna is disposed. For example, a (2-1)$^{th}$ antenna operating as a first Wi-Fi antenna may be disposed in the (2-1)$^{th}$ antenna region 821, and a (2-2)$^{th}$ antenna operating as a second Wi-Fi antenna may be disposed in the (2-2)$^{th}$ antenna region 822. The number of antenna regions included in the second housing structure 420 is limited to two in FIG. 6, the number and locations of antenna regions are not limited thereto and may be changed as necessary.

According to an embodiment, the first side wall structure 510 may include at least one split portion 531, 532, 533, 534, 535, or 536. According to an embodiment, the at least one split portion 531, 532, 533, 534, 535, or 536 may be formed of an insulator. According to an embodiment, the at least one split portion 531, 532, 533, 534, 535, or 536 may be molded into the first side wall structure 510 through a double-injection molding or insert molding method of a synthetic resin. However, without being limited thereto, the at least one split portion 531, 532, 533, 534, 535, or 536 may be made of various materials having insulating properties. According to an embodiment, the first side wall structure 510 may include unit side wall portions 511, 512, 513, 514, 515, 516, and 517 split by respective split portions 531, 532, 533, 534, 535, and 536. For example, a (1-2)$^{th}$ side wall portion 512 may maintain the state of being separated from a (1-1)$^{th}$ side wall portion 511 and a (1-3)$^{th}$ side wall portion 513 by a (1-1)$^{th}$ split portion 531 and a (1-2)$^{th}$ split portion 532, a (1-4)$^{th}$ side wall portion 514 may maintain the state of being separated from a (1-3)$^{th}$ side wall portion 513 and a (1-5)$^{th}$ side wall portion 515 by a (1-3)$^{th}$ split portion 533 and a (1-4)$^{th}$ split portion 534, and a (1-6)$^{th}$ side wall portion 516 may maintain the state of being separated from a (1-5)$^{th}$ side wall portion 515 and a (1-7)$^{th}$ side wall portion 517 by a (1-5)$^{th}$ split portion 535 and a (1-6)$^{th}$ split portion 536. According to an embodiment, at least one of the unit side wall portions 511, 512, 513, 514, 515, 516, and 517 may operate as an antenna operating in a specific frequency band. For example, the (1-1)$^{th}$ side wall portion 511 may operate as the (1-6)$^{th}$ antenna disposed in the (1-6)$^{th}$ antenna region 816, the (1-2)$^{th}$ side wall portion 512 may operate as the (1-7)$^{th}$ antenna disposed in the (1-7)$^{th}$ antenna region 817, the (1-3)$^{th}$ side wall portion 513 may operate as the (1-5)$^{th}$ antenna disposed in the (1-5)$^{th}$ antenna region 815, the (1-5)$^{th}$ side wall portion 515 may operate as the (1-1)$^{th}$ antenna disposed in the (1-1)$^{th}$ antenna region 811, the (1-6)$^{th}$ side wall portion 516 may operate as the (1-2)$^{th}$ antenna disposed in the (1-2)$^{th}$ antenna region 812, and the (1-7)$^{th}$ side wall portion 517 may operate as the (1-4)$^{th}$ antenna disposed in the (1-4)$^{th}$ antenna region 814. The number of split portions included in the first side wall structure 510 is limited to six in FIG. 6, the number and locations of split portions are not limited thereto and may be changed as necessary.

According to an embodiment, the second side wall structure 520 may include at least one split portion 541, 542, 543, 544, 545, or 546. According to an embodiment, the at least one split portion 541, 542, 543, 544, 545, or 546 may be formed of an insulator. According to an embodiment, the at least one split portion 541, 542, 543, 544, 545, or 546 may be molded into the second side wall structure 520 through a double-injection molding or insert molding method of a synthetic resin. However, without being limited thereto, the at least one split portion 541, 542, 543, 544, 545, or 546 may be made of various materials having insulating properties. According to an embodiment, the second side wall structure 520 may include unit side wall portions 521, 522, 523, 524, 525, 526, and 527 split by respective split portions 541, 542, 543, 544, 545, and 546. For example, a (2-2)$^{th}$ side wall portion 522 may maintain the state of being separated from a (2-1)$^{th}$ side wall portion 521 and a (2-3)$^{th}$ side wall portion 523 by a (2-1)$^{th}$ split portion 541 and a (2-2)$^{th}$ split portion 542, a (2-4)$^{th}$ side wall portion 524 may maintain the state of being separated from a (2-3)$^{th}$ side wall portion 523 and a (2-5)$^{th}$ side wall portion 525 by a (2-3)$^{th}$ split portion 543 and a (2-4)$^{th}$ split portion 544, and a (2-6)$^{th}$ side wall portion 526 may maintain the state of being separated from a (2-5)$^{th}$ side wall portion 525 and a (2-7)$^{th}$ side wall portion 527 by a (2-5)$^{th}$ split portion 545 and a (2-6)$^{th}$ split portion 546. According to an embodiment, at least one of the unit side wall portions 521, 522, 523, 524, 525, 526, and 527 may operate as an antenna operating in a specific frequency band. For example, the (2-1)$^{th}$ side wall portion 521 may operate as the (2-1)$^{th}$ antenna disposed in the (2-1)$^{th}$ antenna region 821, and the (2-3)$^{th}$ side wall portion 523 may operate as the (2-2)$^{th}$ antenna disposed in the (2-2)$^{th}$ antenna region 821. The number of split portions included in the second side wall structure 520 is limited to six in FIG. 6, the number and locations of split portions are not limited thereto and may be changed as necessary.

Referring to FIG. 7, a heat dissipation structure 900 may be disposed in the first housing structure 410 of the electronic device 101. According to an embodiment, the heat dissipation structure 900 may include a first printed circuit board 710, at least one heating element 910 (e.g., the processor 713 of FIG. 5) disposed on the first printed circuit board 710, a shield can 920 coupled to at least one surface of the first printed circuit board 710 and including a shape (e.g., a closed tetragonal loop) surrounding at least a portion of the at least one heating element 910, at least one heat transfer member 930 (e.g., a carbon fiber thermal interface material (TIM)) disposed on the at least one heating element 810 and transferring heat generated by the at least one heating element 910, a heat diffusion structure 940 disposed over at least one heat transfer member 930 and at least a portion of the shield can 920, configured to provide a shielding function against electromagnetic waves that may be generated by the at least one heating element 910, and configured to provide a function of transferring heat capable of being generated by the at least one heating element 910 to the outside, at least a portion of the first bracket 610 disposed on the heat diffusion structure 940 and configured to quickly dissipate the heat transferred from the at least one heating element 910 to the outside of the electronic device 101, and/or a heat diffusion material (e.g., a vapor chamber or a laminated graphite) 950 disposed on the at least a portion of the first bracket 610. In the illustrated embodiment, the first printed circuit board 710 is exemplified as a single board, but the various embodiments disclosed herein are not limited thereto, and may include a structure in which a plurality of boards are coupled to face each other. When the first printed circuit board 710 has a structure in which a plurality of boards are coupled to face each other, the at least one heating element 910 may be disposed to form a multi-layer with a heating element disposed on another board in the first printed circuit board 710.

According to an embodiment, the heat diffusion structure 940 may include a heat dissipation member 942 and an elastic member 841 provided along an edge of the heat dissipation member 942. The heat dissipation member 942 of the heat diffusion structure 940 may be disposed in direct contact with the at least one heat transfer member 930, and may diffuse the heat transferred from the at least one heating element 910 and transfer the heat to at least a portion of the first bracket 610. An elastic member 941 of the heat diffusion structure 940 may be connected to the heat dissipation member 942 and disposed on a portion of the shield can 920 to provide an overall elastic force to the heat diffusion structure 940. A heat transfer path connected from the at least one heating element 910 and/or the shield can 920 to at least a portion of the first bracket 610 may be expanded and the at least one heating element 910 may be protected from an external impact by the elastic force of the elastic member 941.

An embodiment in which at least a portion of the first bracket 610 and the heat diffusion material 950 are both disposed on the heat diffusion structure 940 have been described above with reference to FIG. 7, but the at least a portion of the first bracket 610 may be omitted and the heat diffusion material 950 may be disposed directly on the heat diffusion structure 940.

Figure 8:
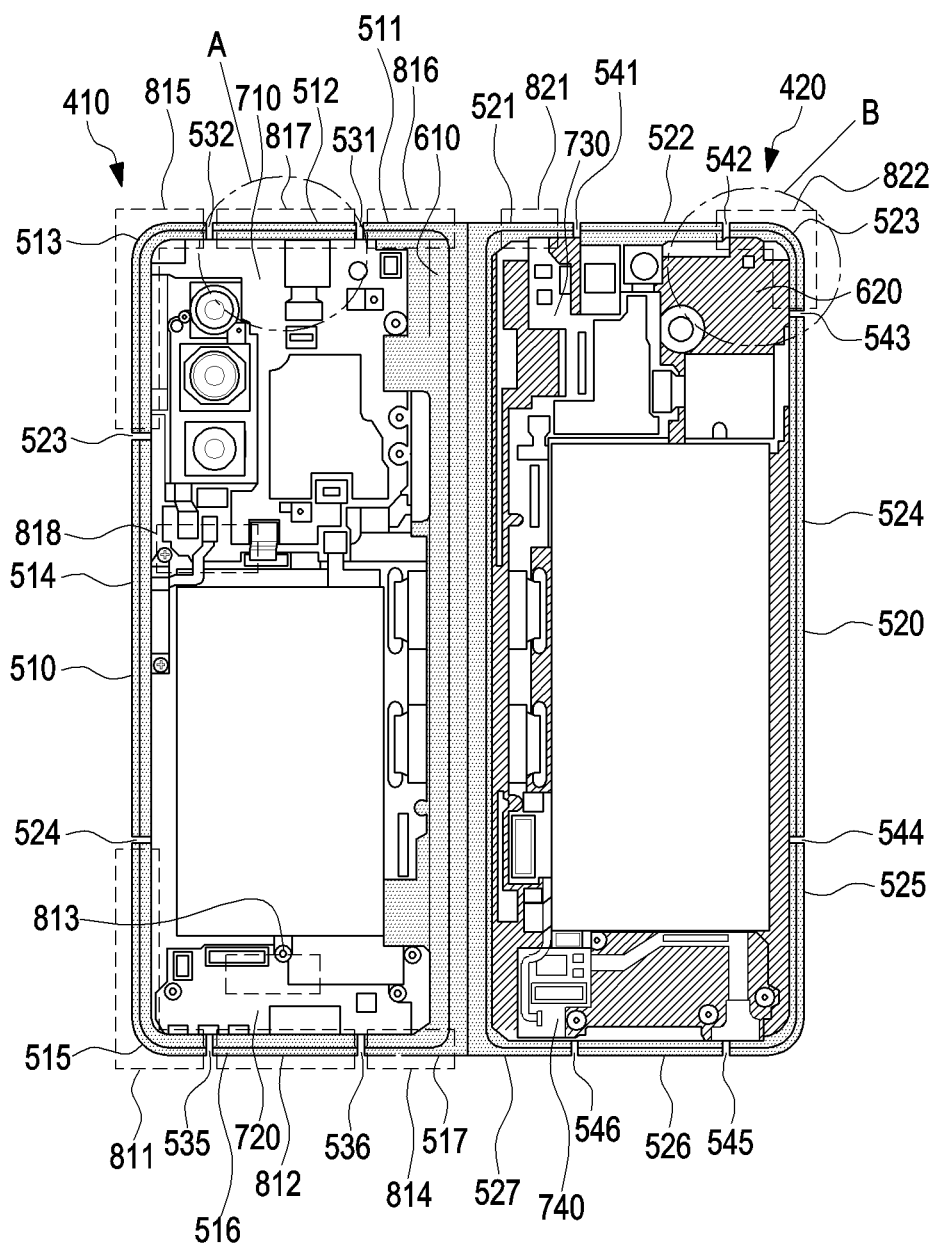
FIG. 8 is a view illustrating an embodiment in which a second housing structure of an electronic device of FIG. 5 is formed of different metal materials according to an embodiment of the disclosure.

FIG. 8 is a view illustrating an embodiment in which a second housing structure of an electronic device of FIG. 5 is formed of different metal materials according to an embodiment of the disclosure.

Referring to FIG. 8, the first side wall structure 510 included in the first housing structure 410 of the electronic device 101 may include a metal material having high electrical conductivity for the performance of the communication device (e.g., antenna performance). For example, the first side wall structure 510 may include an aluminum (Al) material.

According to an embodiment, the first printed circuit board 710 included in the first housing structure 410 may include a structure in which one or more heating elements (e.g., the processor 713 in FIG. 5, a PMIC, and a charger IC), which are heat sources that generate heat, are arranged in multiple layers (e.g., a plurality of PBAs connected by an interposer). For example, the plurality of heating elements may be disposed on the first printed circuit board 710. According to an embodiment, the first bracket 610 coupled to the first side wall structure 510 may include a metal material having high thermal conductivity for heat dissipation performance (e.g., heat transfer or emission). For example, the first bracket 610 coupled to the first side wall structure 510 may include an Al material.

According to an embodiment of the disclosure, the first bracket 610 may include the same metal material as the first side wall structure 510 in order to lower the resistance of a ground (GND) connected to an antenna. For example, the first bracket 610 and the first side wall structure 510 may include an Al material. According to an embodiment, the first side wall structure 510 and the first bracket 610 may be configured integrally.

According to an embodiment, the second housing structure 420 may include a sub-display (e.g., the sub-display 252 in FIGS. 2 to 4) disposed in a region of the rear cover (e.g., the second rear cover 250 in FIGS. 2 to 4). According to an embodiment, the third printed circuit board 730 included in the second housing structure 420 may include a structure in which one or more heating elements (e.g., the third communication device 733 of FIG. 5, a speaker amplifier, a camera filter, and a power module) are arranged in a single layer (e.g., a single-layer PBA structure). For example, by provided in a single-layer PBA structure when the sub-display is disposed in a region of the rear cover, the third printed circuit board 730 may not interfere with a flexible display (e.g., the display 130 in FIG. 4) and/or the sub-display. According to an embodiment, elements that generate relatively less heat compared to the first printed circuit board 710 included in the first housing structure 410 may be disposed on the third printed circuit board 730.

According to an embodiment, the second side wall structure 520 may include a metal material having high electrical conductivity for performance of a communication device (e.g., antenna performance). For example, the second side wall structure 520 may include an Al material.

According to an embodiment, the second bracket 620 coupled to the second side wall structure 520 may include a metal material having a low specific gravity for weight reduction. For example, in the second housing structure 420, the third printed circuit board 730 may include elements that generate relatively less heat compared to the first printed circuit board 710 included in the first housing structure 410. Thus, the degree of design freedom of the second bracket 620 may be higher than that of the first bracket 610 included in the first housing structure 410 in terms of material selection. According to an embodiment, since the second bracket 620 includes a metal material having a low specific gravity, it is possible to reduce the weight increased by the sub-display compared to the first housing structure 410. For example, the second bracket 620 may include a magnesium (Mg) material having a low specific gravity. According to an embodiment, the second side wall structure 520 and the second bracket 620 may include different metal materials. According to an embodiment, the second side wall structure 520 and the second bracket 620 may be configured separably. For example, the second side wall structure 520 and the second bracket 620 may be assembled or coupled to each other through a bonding method, such as welding.

Referring to FIG. 8, the same metal material is shaded in the same manner for convenience of description. For example, in FIG. 8, it can be seen that the first sidewall structure 510, the first bracket 610, and the second side wall structure 520 are shaded in the same way to indicate that they are made of the same metal material (e.g., Al), and the second bracket 620 and the second side wall structure 520 are shaded in different ways to indicate that the second bracket is made of a material (e.g., Mg) different from that of the second side wall structure 520.

When at least a portion of a side wall structure (e.g., the first side wall structure 510 or the second side wall structure 520) in the electronic device 101 of FIG. 8 operates as an antenna, the ground portion of the antenna may mean a ground portion of components (included in the printed circuit board) directly or indirectly connected to an antenna feeding portion of the antenna among the components included in a printed circuit board (the first printed circuit board 710, the second printed circuit board 720, the third printed circuit board 730, or the fourth printed circuit board 740). Hereinafter, when at least a portion of the first side wall structure 510 operates as a first antenna in the first housing structure 410 in which the first side wall structure 510 and the first bracket 610 include the same metal material, the connection state between the ground portion of the first antenna and the ground portion of the first printed circuit board 710 (or the second printed circuit board 720) will be described with reference to FIGS. 9A and 9B. When at least a portion of the second side wall structure 520 operates as a second antenna in the second housing structure 420 in which the second side wall structure 520 and the second bracket 620 include different metal materials, the connection state between the ground portion of the second antenna and the ground portion of the third printed circuit board 730 (or the fourth printed circuit board 740) will be described with reference to FIGS. 10A and 10B.

Figure 9A:
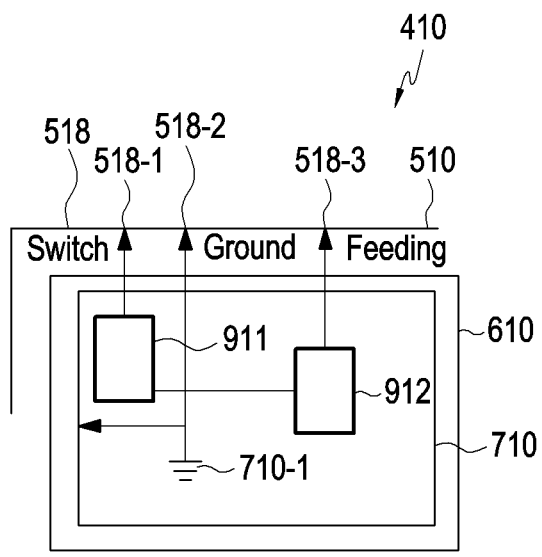
FIGS. 9A and 9B are views each illustrating a ground portion of a first antenna in a first housing structure of an electronic device of FIG. 8 according to an embodiment of the disclosure.
Figure 9B:
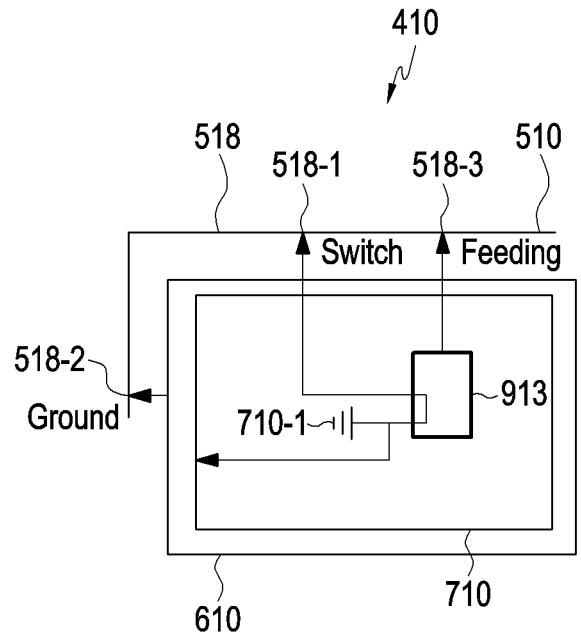

FIGS. 9A and 9B are views each illustrating a ground portion of a first antenna 518 in the first housing structure 410 of the electronic device 101 of FIG. 8 according to an embodiment of the disclosure. FIG. 9A illustrates an embodiment in which the ground portion of the first antenna 518 is connected to a ground portion of a component indirectly connected to the feeding portion of the first antenna 518, and FIG. 9B illustrates an embodiment in which the ground portion of the first antenna 518 is connected to a ground portion of a component directly connected to the feeding portion of the first antenna 518.

Referring to FIG. 9A, at least a portion of the first side wall structure 510 of the electronic device 101 (e.g., the $(1-1)^{th}$ side wall portion 511) may operate as the first antenna 518. According to an embodiment, the first antenna 518 may include a first switch portion 518-1, a first feeding portion 518-3, and a first ground portion 518-2. According to an embodiment, the first switch portion 518-1 of the first antenna 518 may be connected to a first component 911 (e.g., a switch) included in the first printed circuit board 710, and the first component 911 may be connected to a ground portion 710-1 of the first printed circuit board 710. According to an embodiment, the first feeding portion 518-3 of the first antenna 518 may be connected to a second component 912 (e.g., a passive element) included in the first printed circuit board 710, and the second component 912 may be connected to the first component 911 and indirectly connected to the ground portion 710-1 of the first printed circuit board 710. According to an embodiment, the ground portion 710-1 of the first printed circuit board 710 may be connected to the first bracket 610 and may be directly connected to the first ground portion 518-2 of the first antenna 518.

Referring to FIG. 9B, at least a portion of the first side wall structure 510 of the electronic device 101 (e.g., the $(1-1)^{th}$ side wall portion 511) may operate as the first antenna 518. According to an embodiment, the first antenna 518 may include a first switch portion 518-1, a first feeding portion 518-3, and a first ground portion 518-2. According to an embodiment, the first switch portion 518-1 of the first antenna 518 may be connected to a third component 913 (e.g., a switch) included in the first printed circuit board 710, and the third component 913 may be connected to the ground portion 710-1 of the first printed circuit board 710. According to an embodiment, the first feeding portion 518-3 of the first antenna 518 may be connected to the third component 913 included in the first printed circuit board 710. According to an embodiment, the ground portion 710-1 of the first printed circuit board 710 may be connected to the first bracket 610, and the first ground portion 518-2 of the first antenna 518 may be connected to the first bracket 610, so that the first ground portion 518-2 of the first antenna 518 may be indirectly connected to the ground portion 710-1 of the first printed circuit board 710.

An embodiment in which the first ground portion 518-2 of the first antenna 518 is directly or indirectly connected to the ground portion 710-1 of the first printed circuit board 710 has been described with reference to FIGS. 9A and 9B, the embodiment of FIGS. 9A and 9B is also applicable to the second printed circuit board 720 included in the first housing structure 410.

Figure 10A:
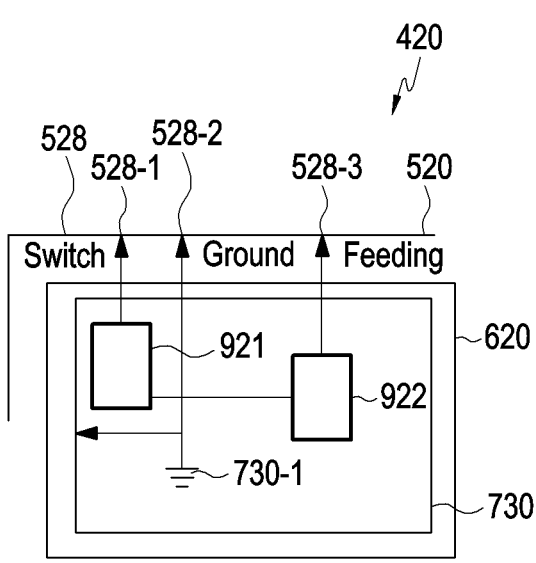
FIGS. 10A and 10B are views each illustrating a ground portion of a second antenna in a second housing structure of an electronic device of FIG. 8 according to an embodiment of the disclosure.
Figure 10B:
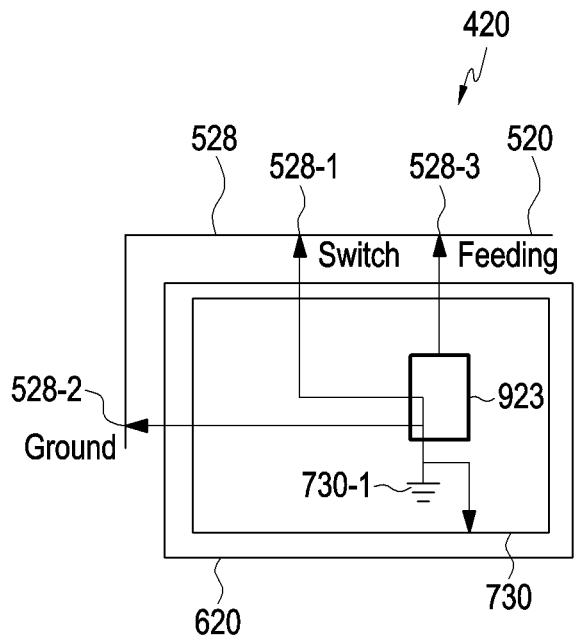

FIGS. 10A and 10B are views each illustrating a ground portion of a second antenna 528 in a second housing structure 420 of an electronic device of FIG. 8 according to an embodiment of the disclosure. FIG. 10A illustrates an embodiment in which a ground portion of a second antenna 528 is connected to a ground portion of a component indirectly connected to a feeding portion of a second antenna 528, and FIG. 10B illustrates an embodiment in which a ground portion of a second antenna 528 is connected to a ground portion of a component directly connected to a feeding portion of a second antenna 528.

Referring to FIG. 10A, at least a portion of the second side wall structure 520 of the electronic device 101 (e.g., the $(2-1)^{th}$ side wall portion 521) may operate as the second antenna 528. According to an embodiment, the second antenna 528 may include a second switch portion 528-1, a second feeding portion 528-3, and a second ground portion 528-2. According to an embodiment, the second switch portion 528-1 of the second antenna 528 may be connected to a fourth component 921 (e.g., a switch) included in the third printed circuit board 730, and the fourth component 921 may be connected to the ground portion 730-1 of the third printed circuit board 730. According to an embodiment, the second feeding portion 528-3 of the second antenna 528 may be connected to a fifth component 922 (e.g., a passive element) included in the third printed circuit board 730, and the fifth component 922 may be connected to the fourth component 921 and indirectly connected to the ground portion 730-1 of the third printed circuit board 730. According to an embodiment, the ground portion 730-1 of the third printed circuit board 730 may be connected to the second bracket 620, and the second ground portion 528-2 of the second antenna 528 may be directly connected to the ground portion 730-1 of the third printed circuit board 730.

Referring to FIG. 10B, at least a portion of the second side wall structure 520 of the electronic device 101 (e.g., the $(2-1)^{th}$ side wall portion 521) may operate as the second antenna 528. According to an embodiment, the second antenna 528 may include a second switch portion 528-1, a second feeding portion 528-3, and a second ground portion 528-2. According to an embodiment, the second switch portion 528-1 of the second antenna 528 may be connected to a sixth component 923 (e.g., a switch) included in the third printed circuit board 730, and the sixth component 923 may be connected to the ground portion 730-1 of the third printed circuit board 730. According to an embodiment, the second feeding portion 528-3 of the second antenna 528 may be connected to the sixth component 923 included in the third printed circuit board 730. According to an embodiment, the ground portion 730-1 of the third printed circuit board 730 may be connected to the second bracket 620, and the second ground portion 528-2 of the second antenna 528 may be directly connected to the ground portion 730-1 of the third printed circuit board 730.

An embodiment in which the second ground portion 528-3 of the second antenna 528 is directly connected to the ground portion 730-1 of the third printed circuit board 730 has been described with reference to FIGS. 10A and 10B, the embodiment of FIGS. 10A and 10B is also applicable to the fourth printed circuit board 740 included in the second housing structure 420.

Referring to FIGS. 9A, 9B, 10A, and 10B, in the case of the first housing structure 410, since the first side wall structure 510 and the first bracket 610 include the same metal material, the first ground portion 518-2 of the first antenna 518 and the ground portion 710-1 of the first printed circuit board 710 may be directly or indirectly connected to each other, but in the case of the second housing structure 420, since the second side wall structure 520 and the second bracket 620 include different metal materials, the second ground portion 528-2 of the second antenna 528 and the ground portion 730-1 of the third printed circuit board 730 may only be directly connected to each other.

Figure 11:
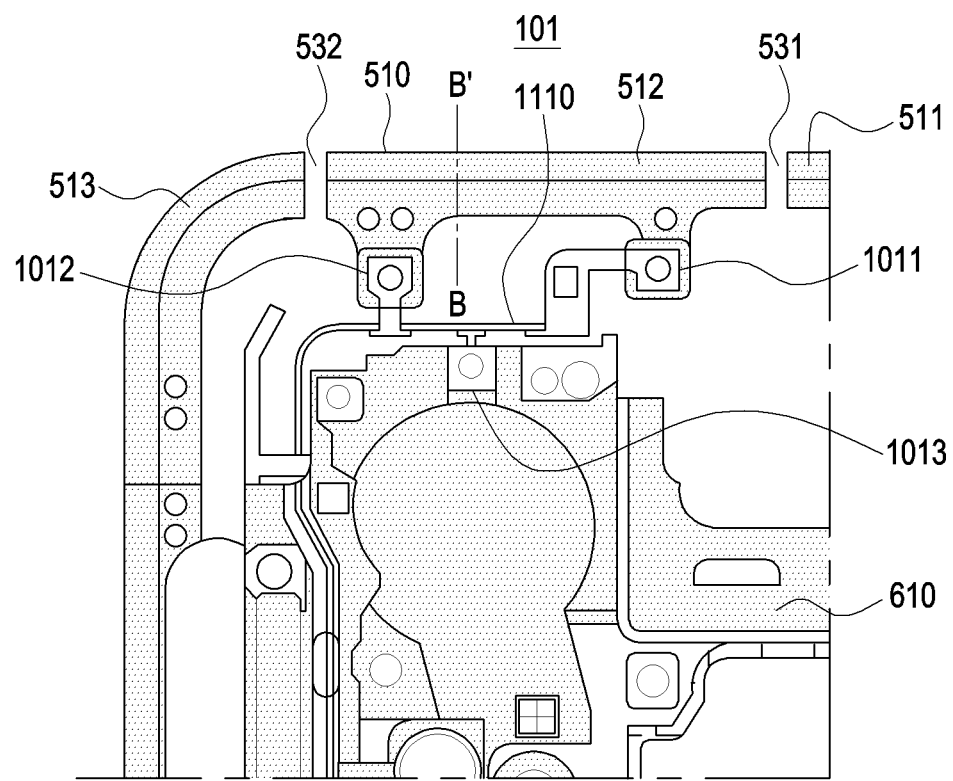
FIG. 11 is an enlarged view of a region A of a first side wall structure of an electronic device of FIG. 8 according to an embodiment of the disclosure.
Figure 12:
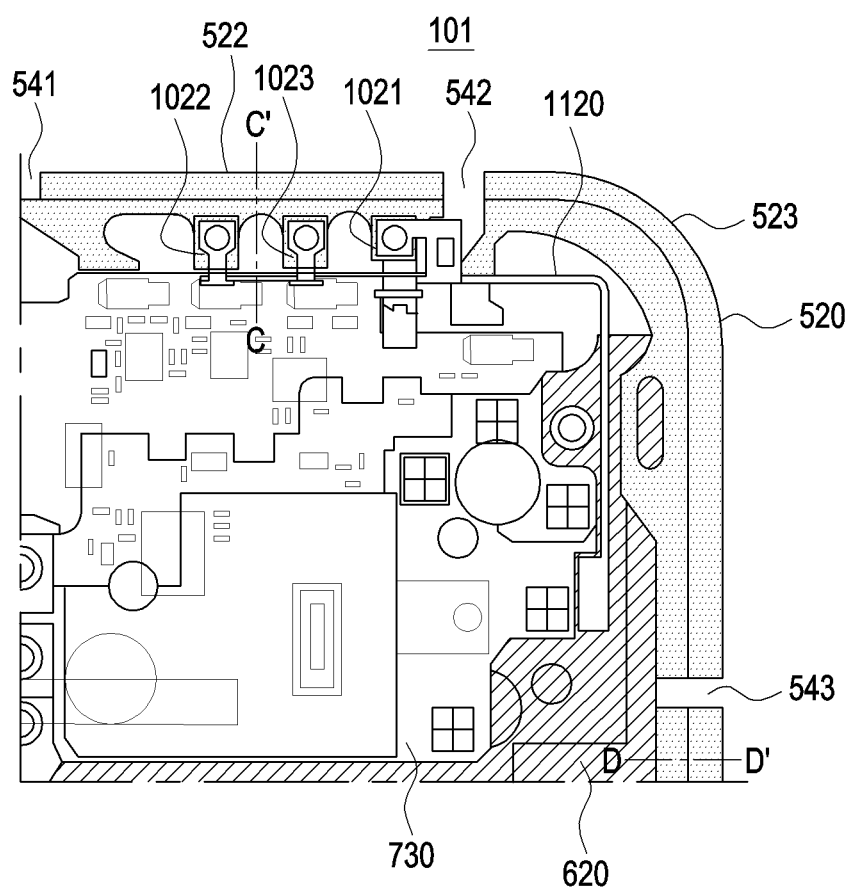
FIG. 12 is an enlarged view of a region B of a second side wall structure of an electronic device of FIG. 8 according to an embodiment of the disclosure.

FIG. 11 is an enlarged view of a region A of a first side wall structure of an electronic device of FIG. 8 according to an embodiment of the disclosure. FIG. 12 is an enlarged view of a region B of a second side wall structure of an electronic device of FIG. 8 according to an embodiment of the disclosure.

Referring to FIG. 11, the first side wall structure 510 may include a $(1-2)^{th}$ side wall portion 511 separated from a $(1-1)^{th}$ side wall portion and a $(1-3)^{th}$ side wall portion by a $(1-1)^{th}$ split portion 531 and a $(1-2)^{th}$ split portion 532. According to an embodiment, the $(1-2)^{th}$ side wall portion 512 may operate as an antenna of the electronic device 101. For example, the $(1-2)^{th}$ side wall portion 512 may operate as the $(1-7)^{th}$ antenna disposed in the $(1-7)^{th}$ antenna region 817 of FIG. 8. According to an embodiment, when operating as the antenna, the $(1-2)^{th}$ side wall portion 512 may include a portion 1011 to which the feeding portion of the antenna is connected and a portion 1012 to which the switch portion of the antenna is connected. According to an embodiment, when the $(1-2)^{th}$ side wall portion 512 operates as the antenna, the first bracket 610 may include a portion 1013 to which the ground portion of the antenna is connected. According to an embodiment, the portion 1011 to which the feeding portion of the antenna included in the $(1-2)^{th}$ side wall portion 512 is connected, the portion 1012 to which the switch portion of the antenna is connected, and the portion 1013 to which the ground portion of the antenna included in the first bracket 610 is connected may be electrically connected to a first flexible printed circuit board (FPCB) 1110, and the first flexible printed circuit board 1110 may be electrically connected to the first printed circuit board 710 in first housing structure 410 via a connector. For example, when the $(1-2)^{th}$ side wall portion 512 operates as the antenna, the ground portion of the antenna may be connected to the portion 1013 to which the ground portion of the antenna included in the first bracket 610 is connected, and may be indirectly electrically connected to the ground portion of the first printed circuit board 710 via the first flexible printed circuit board 1110. According to another embodiment, when the $(1-2)^{th}$ side wall portion 512 operates as the antenna, the portion 1011 to which the feeding portion of the antenna is connected without the portion 1012 to which the switch portion of the antenna is connected and the antenna portion 1013 to which the ground portion of the antenna is connected may be included in the $(1-2)^{th}$ side wall portion 512 and the first bracket 610, respectively.

Referring to FIG. 11, the first side wall structure 510 and the first bracket 610 are made of the same metal material (e.g., Al), and the first side wall structure 610 and the first bracket 610 are integrally configured to minimize resistance due to the bonding structure of the first side structure 510 and the first bracket 610, so that the portion 1013 to which the ground portion of the antenna is connected may be located in the first bracket 610.

Referring to FIG. 12, the second side wall structure 520 may include a $(2-2)^{th}$ side wall portion 522 separated from a $(2-1)^{th}$ side wall portion 521 and a $(2-3)^{th}$ side wall portion 523 by a $(2-1)^{th}$ split portion 541 and a $(2-2)^{th}$ split portion 542. According to an embodiment, the $(2-2)^{th}$ side wall portion 522 may operate as an antenna of the electronic device 101. According to an embodiment, when operating as the antenna, the $(2-2)^{th}$ side wall portion 522 may include a portion 1021 to which the feeding portion of the antenna is connected, a portion 1022 to which the switch of the antenna is connected, and a portion 1023 to which the ground portion of the antenna is connected. According to an embodiment, the portion 1021 to which the feeding portion of the antenna included in the $(2-2)^{th}$ side wall portion 522 is connected, the portion 1022 to which the switch portion of the antenna is connected, and the portion 1023 to which the ground portion of the antenna is connected may be electrically connected to a second flexible printed circuit board 1120, and the second flexible printed circuit board 1120 may be electrically connected to the third printed circuit board 730 in second housing structure 420 via a connector. For example, when the $(2-2)^{th}$ side wall portion 522 operates as the antenna, the ground portion of the antenna may be connected to the portion 1023 to which the ground portion of the antenna included in the $(2-2)^{th}$ side wall portion 522 is connected, and may be directly electrically connected to the ground portion of the third printed circuit board 730 via the second flexible printed circuit board 1120. According to another embodiment, when the $(2-2)^{th}$ side wall portion operates as the antenna, the portion 1021 to which the feeding portion of the antenna is connected without the portion 1022 to which the switch portion of the antenna is connected and the portion 1023 to which the ground portion of the antenna is connected may be included in the $(2-2)^{th}$ side wall portion 522.

In FIG. 12, when the second side wall structure 520 and the second bracket 620 are made of different metals (e.g., the second side wall structure 520 is made of Al and the second bracket 620 is made of Mg), it is possible to prevent an impedance mismatch or an increase in electrical resistance due to a difference in electrical conductivity and/or a difference in electrical conductivity between the different metals by placing the portion 1023 to which the ground of the antenna is connected on the second side wall structure 520 (e.g., the $(2-2)^{th}$ side wall portion 522) together the portion 1022 to which the switch portion of the antenna is connected and the portion 1021 to which the feeding portion of the antenna is connected.

Figure 13:
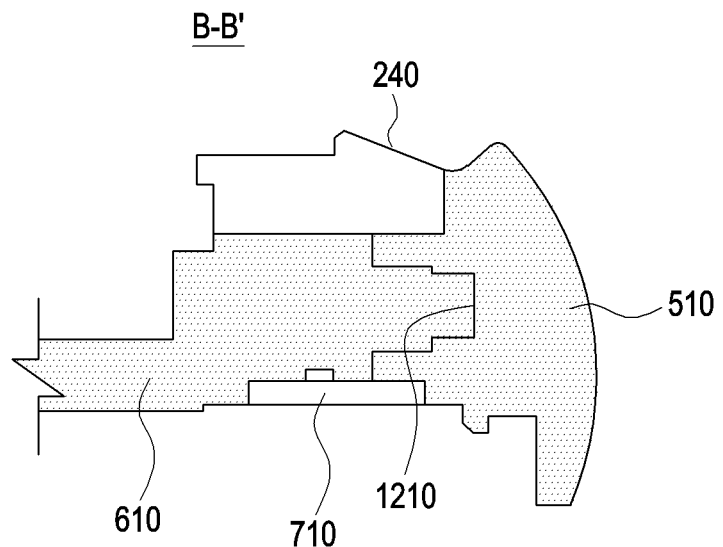
FIG. 13 is a cross-sectional view of an electronic device of FIG. 11, taken in a B-B' direction according to an embodiment of the disclosure.

FIG. 13 is a cross-sectional view of an electronic device taken in a B-B' direction according to an embodiment of the disclosure.

Referring to FIG. 13, the inside of the first side wall structure 510 of the electronic device 101 may include a recess 1210. According to an embodiment, at least a portion of the first bracket 610 may be inserted into the recess 1210 to be electrically coupled to the first side wall structure 510. According to an embodiment, at least a portion of the first printed circuit board 710 may be electrically coupled to the first bracket 610, and another portion of the first printed circuit board 710 may be electrically coupled to the first side wall structure 510. According to an embodiment, at least a portion of the rear cover 240 (e.g., the first rear cover 240 in FIGS. 2 to 4) may be coupled to the first bracket 610, and another portion of the rear cover 240 may be coupled to the first side wall structure 510.

Figure 14:
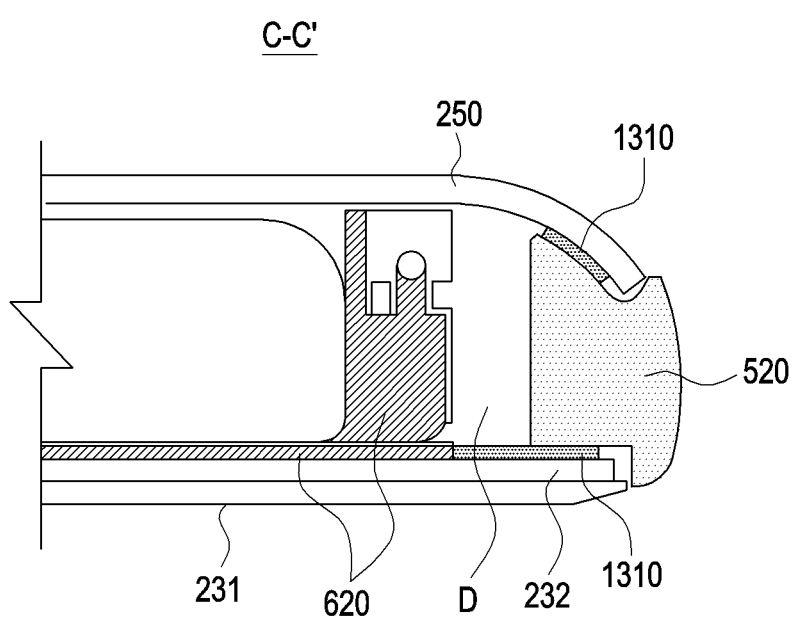
FIG. 14 is a cross-sectional view of an electronic device of FIG. 12, taken in a C-C' direction according to an embodiment of the disclosure.
Figure 15:
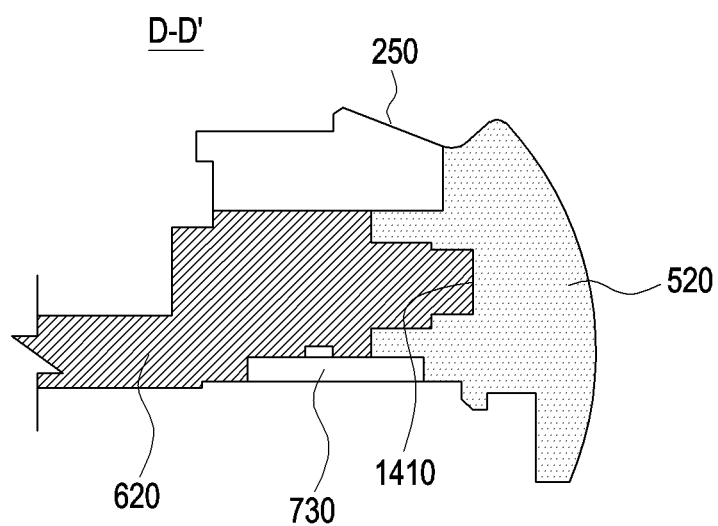
FIG. 15 is a cross-sectional view of an electronic device of FIG. 12, taken in a D-D' direction according to an embodiment of the disclosure.

FIG. 14 is a cross-sectional view of an electronic device taken in a C-C' direction according to an embodiment of the disclosure. FIG. 15 is a cross-sectional view of an electronic device taken in the D-D' direction according to an embodiment of the disclosure. FIG. 14 illustrates a connective relationship between a second side wall structure 520 and a second bracket 620 when at least a portion of a second side wall structure 520 operates as an antenna. FIG. 15 illustrates a connective relationship between a second side wall structure 520 and a second bracket 620 when at least a portion of a second side wall structure 520 does not operate as an antenna.

Referring to FIG. 14, at least a portion of the second side wall structure 520 of the electronic device 101 may be bonded by an adhesive member 1310 to at least a portion of a plate 232 (e.g., the plate 232 in FIG. 4) on which a display panel 231 (e.g., the display panel 231 in FIG. 4) is seated and which is disposed between the display panel 231 and the second bracket 620, and may be bonded to at least a portion of the rear cover 250 (e.g., the second rear cover 250 in FIGS. 2 to 4) by an adhesive member 1310. According to an embodiment, the second bracket 620 may be separated from the second bezel structure 520 through a space D therebetween. According to an embodiment, the space D may be filled with a non-conductive material to physically interconnect the second bracket 620 and the second bezel structure 520.

Referring to FIG. 15, the inside of the second side wall structure 520 of the electronic device 101 may include a recess 1410. According to an embodiment, at least a portion of the second bracket 620 may be inserted into the recess 1410 to be electrically coupled to the second side wall structure 520. According to an embodiment, at least a portion of the third printed circuit board 730 may be electrically coupled to the second bracket 620, and another portion of the third printed circuit board 730 may be electrically coupled to the second side wall structure 520. According to an embodiment, at least a portion of the rear cover 250 (e.g., the second rear cover 250 in FIGS. 2 to 4) may be coupled to the second bracket 620, and another portion of the rear cover 250 may be coupled to the second side wall structure 520.

Figure 16:
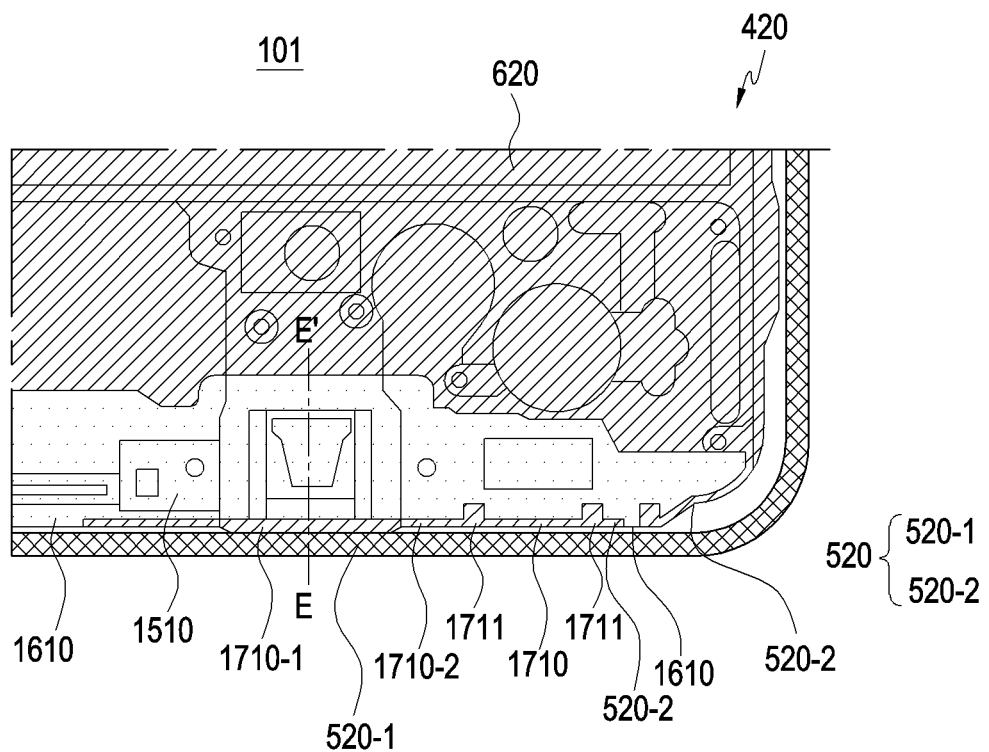
FIG. 16 is a view illustrating an embodiment in which a second housing structure of an electronic device of FIG. 5 is formed of a same metal material according to an embodiment of the disclosure.
Figure 17:
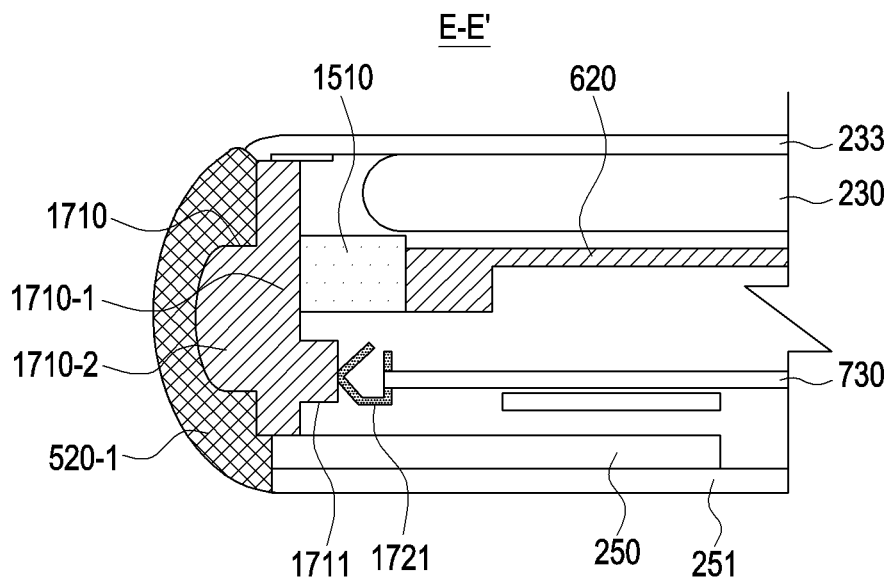
FIG. 17 is a cross-sectional view of an electronic device of FIG. 16, taken in an E-E' direction according to an embodiment of the disclosure.

FIG. 16 is a view illustrating an embodiment in which a second housing structure of an electronic device of FIG. 5 is formed of a same metal material according to an embodiment of the disclosure. FIG. 17 is a cross-sectional view of an electronic device of FIG. 16 taken in a E-E' direction according to an embodiment of the disclosure.

Referring to FIGS. 16 and 17, in the electronic device 101, a portion of the second side wall structure 520 included in the second housing structure 420 may include a non-conductive material (e.g., ceramic) for aesthetic appearance. According to an embodiment, the second side wall structure 520 included in the second housing structure 420 of the electronic device 101 may include a $(2-1)^{th}$ side wall structure 520-1 including a non-conductive material and a $(2-2)^{th}$ second side wall structure 520-2 including a metal material. According to an embodiment, the second housing structure 420 may include a structure in which at least a portion of the $(2-2)^{th}$ side wall structure 520-2 is separated from the second bracket 620. According to an embodiment, between the at least portion of the $(2-2)^{th}$ side wall structure 520-2 and the second bracket 620, a non-conductive material 1510 may be injection molded in order to physically interconnect the at least a portion of the $(2-2)^{th}$ side wall structure 520-2 and a second bracket 620.

According to an embodiment, the $(2-2)^{th}$ side wall structure 520-2 may include at least one pair of split portions 1610. According to an embodiment, the at least one pair of split portions 1610 may be formed of an insulator. According to an embodiment, the at least one pair of split portions 1610 may be molded into the $(2-2)^{th}$ side wall structure through a double-injection molding method or an insert molding method of a synthetic resin. However, the disclosure is not limited thereto, and the at least one pair of split portions 1610 may be made of various materials having an insulating property. According to an embodiment, the $(2-2)^{th}$ side wall structure 520-2 may include a side wall portion 1710 split by the one pair of split portions 1610.

According to an embodiment, the side wall portion 1710 may operate as an antenna of the electronic device 101. According to an embodiment, the side wall portion 1710 may include a first portion 1710-1 that extends to the $(2-1)^{th}$ side wall structure 520-1 to emit a signal, and a second portion 1710-2 that includes at least one antenna element 1711 (e.g., a switch portion of the antenna, a feeding portion of the antenna, or a ground portion of the antenna). According to an embodiment, the at least one antenna element 1711 may be electrically connected to the third printed circuit board 730 in the second housing structure 420 via an antenna connection portion 1721 (e.g., a C-clip).

According to an embodiment, when a portion of the at least one antenna element 1711 included in the first portion 1710-1 of the side wall portion 1710 is located on the second bracket 620, the $(2-2)^{th}$ side wall structure 520-2 including the side wall portion 1710 and the second bracket 620 may include the same metal material in order to prevent the occurrence of signal distortion due to a difference in electrical conductivity between different metals and/or an increase in impedance mismatch or electrical resistance due to the difference in electrical conductivity.

According to an embodiment, the second housing structure 420 may include a display 230 (e.g., the display 230 in FIGS. 2 to 4) and a window glass 233 that protects the display 230. According to an embodiment, the second housing structure 420 may include a sub-display 252 (e.g., the sub-display 252 in FIGS. 2 to 4) disposed in a region of the rear cover 250 (e.g., the second rear cover 250 in FIGS. 2 to 4).

According to an embodiment, the second housing structure 420 may be relatively heavy in weight compared to the first housing structure (not illustrated) due to an additional configuration such as the sub-display 252. Thus, in order to reduce the weight of the second housing structure 420, the $(2-2)^{th}$ side wall structure 520-2 and the second bracket 620 included in the second housing structure 420 may include a metal material having a low specific gravity. For example, the $(2-2)^{th}$ side wall structure 520-2 and the second bracket 620 may include a Mg material.

According to an embodiment, the $(2-2)^{th}$ side wall structure 520-2 and the second bracket 620 included in the second housing structure 420 may include a metal material having a low specific gravity (e.g., Mg) for weight reduction. According to an embodiment, since the side wall portion 1710 included in the $(2-2)^{th}$ side wall structure 520-2 includes the same metal material as the second bracket 620, signal distortion due to an increase in impedance mismatch or electrical resistance due to a difference in electrical conductivity may not occur even when a portion of the at least one antenna element 1711 included in the first portion 1710-1 of the side wall portion 1710 is located in the second bracket 620. According to an embodiment, since the (2-2)$^{th}$ side wall structure 520-2 and the second bracket 620 included in the second housing structure 420 may include the same metal having low electrical conductivity (e.g., Mg), the second housing structure 420 may further include a signal amplifier (e.g., a power amplifier module (PAM)) in order to compensate for signal distortion (e.g., signal loss) due to low electrical conductivity.

According to an embodiment of the disclosure, an electronic device (e.g., 101 in FIGS. 1 to 5) may include a foldable housing including: a hinge structure (e.g., the hinge structure 264 in FIG. 4), a first housing (e.g., the first housing 210 in FIGS. 2 to 4 or the first housing 410 in FIGS. 5 and 6) connected to the hinge structure and including a first side wall structure and a first bracket located inside the first side wall structure, and a second housing (e.g., the second housing 220 in FIGS. 2 to 4 or the second housing 420 in FIGS. 5 and 6) connected to the hinge structure and including a second side wall structure and a second bracket located inside the second side wall structure, the second housing being folded with the first housing about the hinge structure, a display panel (e.g., the display panel 231 in FIGS. 2 and 3) extending from the first housing to the second housing across the hinge structure and configured to output a screen, and a second antenna structure (e.g., the second antenna structure 542 in FIGS. 5 and 6) including a second ground and a second feeding portion disposed on the second side wall structure of the second housing, wherein the first side wall structure of the first housing and the second side wall structure of the second housing may include a first metal material, and the first bracket of the first housing includes the first metal material, and the second bracket of the second housing may include a second metal material.

In the electronic device (e.g., 101 of FIGS. 1 to 5) according to an embodiment, the first metal material has higher electrical conductivity and thermal conductivity than the second metal material, and the second metal material may have a lower specific gravity than the first metal.

In the electronic device (e.g., 101 in FIGS. 1 to 5) according to an embodiment, the first metal material may be aluminum (Al).

In the electronic device (e.g., 101 in FIGS. 1 to 5) according to an embodiment, the second metal material may be a magnesium (Mg) material.

In the electronic device (e.g., 101 in FIGS. 1 to 5) according to an embodiment, the second antenna structure may further include a second antenna switch disposed on the second side wall structure of the second housing.

The electronic device (e.g., 101 in FIGS. 1 to 5) according to an embodiment may further include a first antenna structure provided by a portion of the first housing, wherein the first antenna structure may include a first feeding portion disposed on the first side wall structure, and a first ground disposed on the first bracket.

In the electronic device (e.g., 101 in FIGS. 1 to 5) according to an embodiment, the first antenna structure may further include a first antenna switch disposed on the first side wall structure of the first housing.

In the electronic device (e.g., 101 in FIGS. 1 to 5) according to an embodiment, the first side wall structure and the first bracket may be integrally configured.

In the electronic device (e.g., 101 in FIGS. 1 to 5) according to an embodiment, the second side wall structure and the second bracket may be separably configured.

The electronic device (e.g., 101 in FIGS. 1 to 5) according to an embodiment may further include a sub-display panel that is disposed on a surface of the second housing that is opposite to the surface on which the display panel is disposed.

The electronic device (e.g., 101 in FIGS. 1 to 5) according to an embodiment may further include a first printed circuit board supported by the first bracket, and a second printed circuit board supported by the second bracket.

In the electronic device (e.g., 101 in FIGS. 1 to 5) according to an embodiment, the first printed circuit board may have a structure in which one or more heating elements, which are heat sources, are disposed in multiple layers.

In the electronic device (e.g., 101 in FIGS. 1 to 5) according to an embodiment, the second printed circuit board may have a structure in which one or more heating elements, which are heat sources, are disposed in a single layer.

The electronic device (e.g., 101 in FIGS. 1 to 5) according to an embodiment may further include a heat dissipation structure disposed on the first printed circuit board.

In the electronic device (e.g., 101 in FIGS. 1 to 5) according to an embodiment, the heat dissipation structure may include: a shield can mounted on one surface of the first printed circuit board in a state of accommodating the heating elements and having a shape surrounding at least some of the heating elements, a heat transfer member disposed on the heating elements and configured to transfer heat generated by the heating elements, and a heat diffusion structure disposed on at least a portion of the heat transfer member and the shield can to provide a function of transferring outward heat generated by the heating elements, wherein the heat diffusion structure may be disposed to be at least partially in contact with the first bracket.

In the electronic device (e.g., 101 in FIGS. 1 to 5) according to various embodiments, the heat generated from the heating element may move to the first bracket via the heat transfer member and the heat diffusion structure.

In the electronic device (e.g., 101 in FIGS. 1 to 5) according to various embodiments, the heat dissipation structure may further include a vapor chamber that is disposed on the first bracket and absorbs or diffuses heat transferred thereto from the heat diffusion structure via the first bracket.

In an electronic device (e.g., 101 in FIGS. 1 to 5) according to various embodiments, the heat diffusion structure may include a heat dissipation member and an elastic member disposed along an edge of the heat dissipation member, the heat dissipation member may be disposed to be in direct contact with the heat transfer member and is configured to diffuse heat transferred thereto from the heating element, and the elastic member may be connected to the heat dissipation member and disposed on a portion of the shield can.

In the electronic device (e.g., 101 of FIGS. 1 to 5) according to various embodiments, the second side wall structure may be coupled, by an adhesive member, to at least a portion of a plate on which the display panel is seated and disposed between the display panel and the second bracket, and a separated space may be included between the second side wall structure and the second bracket.

The electronic device (e.g., 101 in FIGS. 1 to 5), may further include a second recess provided inside the second side wall structure, wherein the second bracket may be at least partially inserted into the second recess to be coupled to the second side wall structure.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a foldable housing including:
      a hinge structure,
      a first housing connected to the hinge structure, and including a first side wall structure and a first bracket supporting at least a first electrical component of the electronic device, wherein at least a part of the first bracket is integrally coupled to at least a part of the first side wall structure, and
      a second housing connected to the hinge structure, and including a second side wall structure and a second bracket supporting at least a second electrical component of the electronic device, wherein at least a part of the second bracket is integrally coupled to at least a part of the second side wall structure, and wherein the second housing is foldable with the first housing about the hinge structure;
   a display panel extending from the first housing to the second housing across the hinge structure and configured to output a screen; and
   a first antenna structure including at least a portion of the second side wall structure that is electrically connected directly to a first ground portion and electrically connected directly to a first feeding portion,
   wherein the first side wall structure, the first bracket, and the second side wall structure include a first metal material,
   wherein the second bracket includes a second metal material, and
   wherein the first metal material and second metal material are different metal materials having different properties.

2. The electronic device of claim 1, wherein the first metal material has higher electrical conductivity and specific gravity than the second metal material.

3. The electronic device of claim 2,
   wherein the first metal material is an aluminum (Al) material, and
   wherein the second metal material is a magnesium (Mg) material.

4. The electronic device of claim 1, wherein the first metal material has higher thermal conductivity than the second metal material.

5. The electronic device of claim 1, wherein the at least the portion of the second side wall structure is electrically connected directly to a first antenna switch.

6. The electronic device of claim 1, further comprising:
   a second antenna structure including at least a portion of the first side wall structure that is electrically connected directly to a second feeding portion,
   wherein that at least the portion of the first side wall structure is one of electrically connected directly to a second ground portion or electrically connected indirectly to the second ground portion via the first bracket.

7. The electronic device of claim 6, wherein the at least the portion of the first side wall structure is electrically connected directly to a second antenna switch.

8. The electronic device of claim 1, further comprising:
   a sub-display panel disposed in the second housing,
   wherein the sub-display panel and the display panel are disposed on opposite surfaces of the second housing.

9. The electronic device of claim 1,
   wherein the first electrical component includes a first printed circuit board, and
   wherein the second electrical component includes a second printed circuit board.

10. The electronic device of claim 9, wherein the first printed circuit board has a structure in which one or more heating elements, which are heat sources for generating heat, are arranged in multiple layers.

11. The electronic device of claim 9, wherein the second printed circuit board has a structure in which one or more heating elements, which are heat sources for generating heat, are arranged in a single layer.

12. The electronic device of claim 9, further comprising:
    a heat dissipation structure disposed on the first printed circuit board.

13. The electronic device of claim 12,
    wherein the heat dissipation structure includes:
       a shield can mounted on one surface of the first printed circuit board in a state of accommodating heating elements and having a shape surrounding at least some of the heating elements;
       a heat transfer member disposed on the heating elements and configured to transfer heat generated by the heating elements; and
       a heat diffusion structure disposed on at least a portion of the heat transfer member and the shield can to provide a function of transferring outward heat generated by the heating elements, and
    wherein the heat diffusion structure is disposed to be at least partially in contact with the first bracket.

14. The electronic device of claim 13, wherein the heat generated by the heating elements moves to the first bracket via the heat transfer member and the heat diffusion structure.

15. The electronic device of claim 13, wherein the heat dissipation structure further includes a vapor chamber disposed on the first bracket to absorb or diffuse heat transferred thereto from the heat diffusion structure via the first bracket.

16. The electronic device of claim 13,
    wherein the heat diffusion structure includes a heat dissipation member and an elastic member disposed along an edge of the heat dissipation member,
    wherein the heat dissipation member is disposed to be in direct contact with the heat transfer member and is configured to diffuse heat transferred thereto from the heating elements, and
    wherein the elastic member is connected to the heat dissipation member and disposed on a portion of the shield can.

17. The electronic device of claim 1, wherein the second side wall structure is coupled, by an adhesive member, to at least a portion of a plate on which the display panel is seated and disposed between the display panel and the second bracket.

18. The electronic device of claim 1,
    wherein a recess is formed into the at least the part of the second side wall structure, and
    wherein the at least the part of the second bracket that is integrally coupled to the at least the part of the second side wall structure is at least partially disposed in the recess.

* * * * *